(12) United States Patent
Jung et al.

(10) Patent No.: US 12,218,669 B2
(45) Date of Patent: Feb. 4, 2025

(54) DUAL-EDGE-TRIGGERED FLIP-FLOP

(71) Applicant: SAMSUNG ELECTRONICS CO., LTD., Suwon-si (KR)

(72) Inventors: Seong-Ook Jung, Seoul (KR); Se Keon Kim, Seoul (KR); Hyunjun Kim, Suwon-si (KR); Kyeong Rim Baek, Seoul (KR); Keonhee Cho, Seoul (KR)

(73) Assignees: SAMSUNG ELECTRONICS CO., LTD., Suwon-si (KR); UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 62 days.

(21) Appl. No.: 18/330,731

(22) Filed: Jun. 7, 2023

(65) Prior Publication Data
US 2024/0048132 A1  Feb. 8, 2024

(30) Foreign Application Priority Data

Aug. 2, 2022  (KR) .......................... 10-2022-0096196

(51) Int. Cl.
  *H03K 3/356*  (2006.01)
  *H03K 3/012*  (2006.01)
  *H03K 3/037*  (2006.01)

(52) U.S. Cl.
  CPC .............. *H03K 3/037* (2013.01); *H03K 3/012* (2013.01); *H03K 3/356104* (2013.01); *H03K 3/356121* (2013.01)

(58) Field of Classification Search
  CPC .. H03K 3/012; H03K 3/037; H03K 3/356104; H03K 3/356113; H03K 3/356121
  See application file for complete search history.

(56) References Cited

U.S. PATENT DOCUMENTS 5,179,295 A    1/1993  Mattison et al.
6,239,640 B1 *  5/2001  Liao ....................... H03K 3/012
                                          327/218

(Continued)

FOREIGN PATENT DOCUMENTS

KR    10-0244415    11/1999

OTHER PUBLICATIONS

R. Hossain, L. D. Wronski, and A. Albicki, "Low power design using double edge triggered flip-flops," IEEE Trans. Very Large Scale Integr. (VLSI) Syst., vol. 2, No. 2, pp. 261-265, Jun. 1994.

(Continued)

*Primary Examiner* — Patrick O Neill
(74) *Attorney, Agent, or Firm* — F. Chau & Associates, LLC

(57) ABSTRACT

A flip-flop includes an input logic circuit, a first latch, a second latch, and an output multiplexer; where the input logic circuit outputs a clock bar signal based on an input data bit and a clock signal, where the first latch and the second latch operate based on the input data bit, the clock signal, and a clock bar signal, where the output multiplexer operates based on outputs from nodes of the first and second nodes and outputs an output data bit, and where the input logic circuit has a uniform value in a period where there is no change of a value of the output data bit.

20 Claims, 23 Drawing Sheets

(56) References Cited

U.S. PATENT DOCUMENTS

| | | | | |
|---|---|---|---|---|
| 6,462,596 | B1* | 10/2002 | Varma | H03K 3/356173 |
| | | | | 327/210 |
| 6,489,825 | B1* | 12/2002 | Pasqualini | H03K 3/012 |
| | | | | 327/201 |
| 6,794,916 | B1* | 9/2004 | Varma | H03K 3/012 |
| | | | | 327/210 |
| 7,161,846 | B2 | 1/2007 | Padaprambil | |
| 8,004,908 | B2 | 8/2011 | Asano et al. | |
| 8,432,209 | B2 | 4/2013 | Sofer et al. | |
| 8,754,692 | B2 | 6/2014 | Tang | |
| 2007/0013424 | A1 | 1/2007 | Padaparambil | |
| 2009/0085629 | A1* | 4/2009 | Harris | H03K 3/356104 |
| | | | | 326/40 |
| 2012/0306556 | A1* | 12/2012 | Ramaraju | H03K 3/356156 |
| | | | | 327/199 |

OTHER PUBLICATIONS

A. Bonetti, A. Teman, and A. Burg, "An overlap-contention free true-single-phase clock dual-edge-triggered flip-flop," in Proc. IEEE Int. Symp. Circuits Syst. (ISCAS), Lisbon, May 2015, pp. 1850-1853.

Y. Lee, G. Shin and Y. Lee, "A Fully Static True-Single-Phase-Clocked Dual-Edge-Triggered Flip-Flop for Near-Threshold Voltage Operation in IoT Applications," in IEEE Access, vol. 8, pp. 40232-40245, 2020.

* cited by examiner

FIG. 4

X:floating State

| State Number | Figure | CK | D | DPb | DNb | CKb |
|---|---|---|---|---|---|---|
| 1 | 19 | 0 | 0 | 0 | 0 | 1 |
| 2 | 20 | 0 | 0 | 0 | 1 | 1 |
| 3 | 15 | 0 | 0 | 1 | 0 | X |
| 4 | 6 | 0 | 0 | 1 | 1 | X |
| 5 | 12 | 0 | 1 | 0 | 0 | 1 |
| 6 | 18 | 0 | 1 | 0 | 1 | 1 |
| 7 | 9 | 0 | 1 | 1 | 0 | 1 |
| 8 | 8 | 0 | 1 | 1 | 1 | 1 |
| 9 | 13 | 1 | 0 | 0 | 0 | 0 |
| 10 | 21 | 1 | 0 | 0 | 1 | 0 |
| 11 | 14 | 1 | 0 | 1 | 0 | 0 |
| 12 | 7 | 1 | 0 | 1 | 1 | 0 |
| 13 | 11 | 1 | 1 | 0 | 0 | X |
| 14 | 17 | 1 | 1 | 0 | 1 | 0 |
| 15 | 10 | 1 | 1 | 1 | 0 | X |
| 16 | 16 | 1 | 1 | 1 | 1 | 0 |

DUAL-EDGE-TRIGGERED FLIP-FLOP

CROSS-REFERENCE TO RELATED APPLICATIONS

This application claims priority under 35 U.S.C. § 119 to Korean Patent Application No. 10-2022-0096196, filed on Aug. 2, 2022 in the Korean Intellectual Property Office, the disclosure of which is incorporated by reference herein in its entirety.

FIELD

Embodiments of the present disclosure relate to a flip-flop, and more particularly, relate to a dual-edge-triggered flip-flop.

DISCUSSION

As the usage of flip-flops for low-voltage operation in system-on-chip (SoC) devices increases, the power consumption, robustness, and area of the flip-flops are emerging as ever more important factors.

For example, redundant signal transitions may unnecessarily increase power consumption. Accordingly, it is desirable to reduce such unnecessary power consumption.

SUMMARY

Embodiments of the present disclosure may provide a flip-flop preventing a redundant transition of a clock bar signal, which is based on a clock signal, in a period where a value of an output data bit of the flip-flop does not change.

According to an embodiment, a flip-flop includes an input logic circuit that includes a first inverter receiving an input data bit, and a first clocked complementary metal-oxide semiconductor (C2MOS) circuit receiving an output of the first inverter and a clock signal to output a clock bar signal, a first latch that includes a second C2MOS circuit receiving the input data bit, the clock signal, and the clock bar signal, a third C2MOS circuit, and a second inverter including an input terminal connected with an output terminal of the second C2MOS circuit and an output terminal of the third C2MOS circuit and an output terminal connected with an input terminal of the third C2MOS circuit, a second latch that includes a fourth C2MOS circuit receiving the input data bit, the clock signal, and the clock bar signal, a fifth C2MOS circuit, and a third inverter including an input terminal connected with an output terminal of the fourth C2MOS circuit and an output terminal of the fifth C2MOS circuit and an output terminal connected with an input terminal of the fifth C2MOS circuit, and an output multiplexer that outputs an output data bit by inverting a signal which is based on at least one of an output signal of a node between PMOS transistors of the second C2MOS circuit, an output signal of a node between NMOS transistors of the second C2MOS circuit, an output signal of a node between PMOS transistors of the fourth C2MOS circuit, and an output signal of a node between NMOS transistors of the fourth C2MOS circuit.

According to an embodiment, a flip-flop which outputs an output data bit based on a clock signal and an input data bit includes an input logic circuit that outputs a clock bar signal whose value does not change in a period where the output data bit has a uniform value, based on the input data bit and the clock signal, a first latch that latches the input data bit in response to the clock signal having a first value, a second latch that latches the input data bit in response to the clock signal having a second value, and an output multiplexer that outputs the output data bit based on data latched by the first latch and data latched by the second latch.

According to an embodiment, a flip-flop includes an input logic circuit that includes a first PMOS transistor, a third PMOS transistor, and a third NMOS transistor, and a first NMOS transistor connected in series between a node provided with a power supply voltage and a node provided with a ground voltage, a second PMOS transistor connected in parallel with the first PMOS transistor, a second NMOS transistor connected in parallel with the first NMOS transistor, and a first inverter including an output terminal connected with a gate electrode of the first PMOS transistor and a gate electrode of the first NMOS transistor, a first latch that includes a fourth PMOS transistor, a fifth PMOS transistor, a fifth NMOS transistor, and a fourth NMOS transistor connected in series between the node provided with the power supply voltage and the node provided with the ground voltage, a sixth PMOS transistor, a seventh PMOS transistor, a seventh NMOS transistor, and a sixth NMOS transistor connected in series between the node provided with the power supply voltage and the node provided with the ground voltage, and a second inverter including an input terminal connected with a node between the fifth PMOS transistor and the fifth NMOS transistor and a node between the seventh PMOS transistor and the seventh NMOS transistor and an output terminal connected with a gate electrode of the seventh PMOS transistor and a gate electrode of the seventh NMOS transistor, a second latch that includes an eighth PMOS transistor, a ninth PMOS transistor, a ninth NMOS transistor, and an eighth NMOS transistor connected in series between the node provided with the power supply voltage and the node provided with the ground voltage, a tenth PMOS transistor, an eleventh PMOS transistor, an eleventh NMOS transistor, and a tenth NMOS transistor connected in series between the node provided with the power supply voltage and the node provided with the ground voltage, and a third inverter including an input terminal connected with a node between the ninth PMOS transistor and the ninth NMOS transistor and a node between the eleventh PMOS transistor and the eleventh NMOS transistor and an output terminal connected with a gate electrode of the eleventh PMOS transistor and a gate electrode of the eleventh NMOS transistor, and an output multiplexer that includes a thirteenth PMOS transistor and a thirteenth NMOS transistor connected in series between a first node between the fourth PMOS transistor and the fifth PMOS transistor and a second node between the fifth NMOS transistor and the fourth NMOS transistor, a twelfth PMOS transistor and a twelfth NMOS transistor connected in series between a third node between the eighth PMOS transistor and the ninth PMOS transistor and a fourth node between the ninth NMOS transistor and the eighth NMOS transistor, and a fourth inverter including an input terminal connected with a node between the twelfth PMOS transistor and the twelfth NMOS transistor and a node between the thirteenth PMOS transistor and the thirteenth NMOS transistor.

BRIEF DESCRIPTION OF THE DRAWINGS

The above and other embodiments of the present disclosure will become more apparent by describing in detail embodiments thereof with reference to the accompanying drawings.

FIG. 4 is a tabular diagram that illustrates values of a clock bar signal according to a clock signal and an input data bit input to a flip-flop of FIG. 3, a signal latched by a first latch, and a signal latched by a second latch.

DETAILED DESCRIPTION

Below, embodiments of the present disclosure will be described in detail to such an extent that one of ordinary skill in the pertinent art may easily implement the invention.

In the detailed description, components described with reference to the terms "unit", "module", "block", "~er or ~or", etc. and function blocks illustrated in drawings may be implemented with software, hardware, or a combination thereof. For example, the software may be or include machine code, firmware, embedded code, and/or application software. For example, the hardware may be or include an electrical circuit, an electronic circuit, a processor, a computer, an integrated circuit, integrated circuit cores, a pressure sensor, an inertial sensor, a microelectromechanical system (MEMS), a passive element, and/or a combination thereof.

Figure 1:
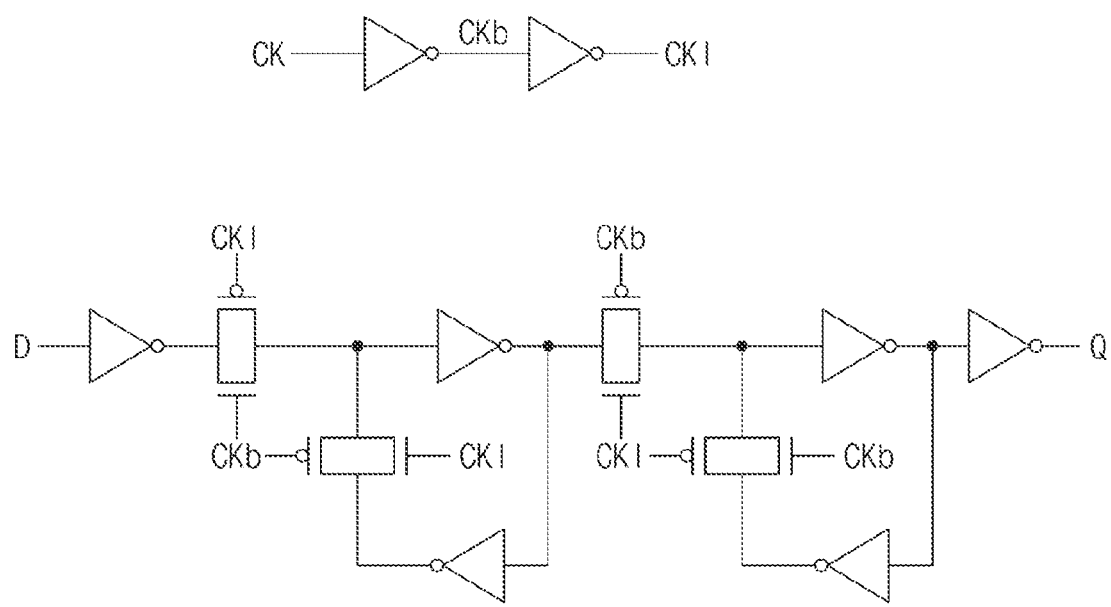
FIG. 1 is a circuit diagram that illustrates a configuration of a non-optimized flip-flop.

FIG. 1 illustrates a configuration of a flip-flop. A flip-flop 10 receives a clock signal CK and generates clock signals CKb and CKl by using at least one inverter. The clock bar signal CKb may have a phase substantially opposite to that of the clock signal CK, and the clock signal CKl may have substantially the same phase as the clock signal CK. Also, the flip-flop 10 may include a transmission gate composed of a PMOS transistor and an NMOS transistor.

If the phase transition of the clock is made at internal nodes of the flip-flop 10 using the clock signals CKb and CKl, the dynamic power of the flip-flop 10 might increase. In addition, because the two clocks CKb and CKl whose phases are substantially opposite to each other overlap each other at the transmission gate, the operation of the flip-flop 10 might become unstable at a low voltage.

Accordingly, it may be desirable to reduce the unnecessary power consumption due to the redundant transition of the clock signals CKb and CKl, such as might be made in a period where a value of an output data bit "Q" of the flip-flop 10 does not change, and to prevent any unstable operation that might be caused by the transmission gate at the low voltage.

Figure 2:
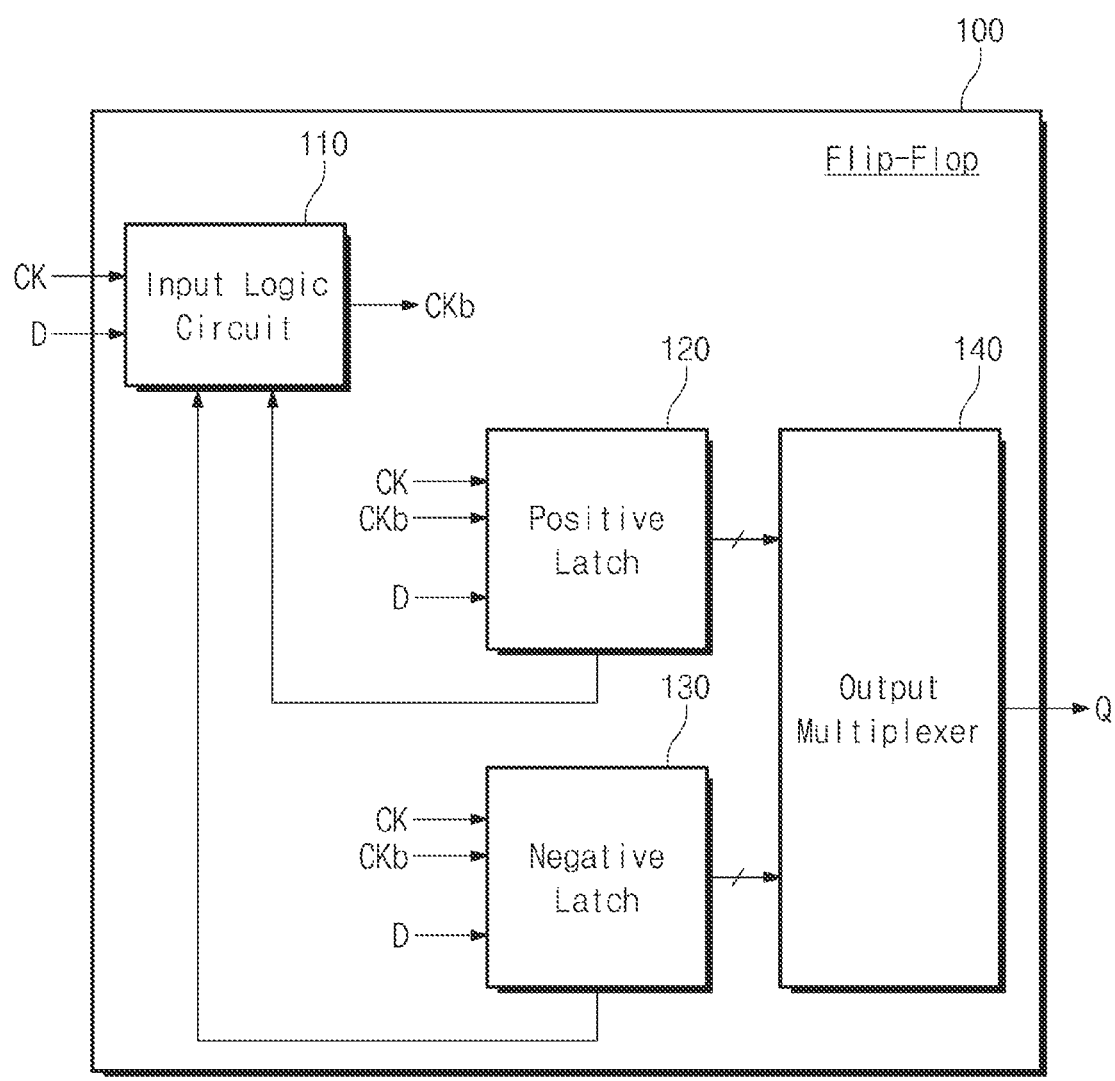
FIG. 2 is a block diagram that illustrates a configuration of a flip-flop according to an embodiment of the present disclosure.

FIG. 2 illustrates a configuration of a flip-flop 100 according to an embodiment of the present disclosure. Referring to FIG. 2, the flip-flop 100 may include an input logic circuit 110, a first latch 120 connected to the input logic circuit, a second latch 130 connected to the input logic circuit, and an output multiplexer 140. The flip-flop 100 of the present disclosure may be a dual-edge-triggered flip-flop connected to the first and second latches. Accordingly, all else being equal, a frequency at which the flip-flop 100 operates may be half of a frequency at which a single-edge triggered flip-flop operates, and power consumption of the flip-flop 100 may be half of power consumption of the single-edge triggered flip-flop.

The input logic circuit 110 may receive a clock signal CK and an input data bit "D" from the outside. The input logic circuit 110 may generate a clock bar signal CKb based on the clock signal CK and the input data bit "D". Unlike the non-optimized clock bar signal CKb described with reference to FIG. 1, the clock bar signal CKb need not be an inverse signal of the clock signal CK. In an embodiment, the clock bar signal CKb of the present disclosure may maintain a uniform value (e.g., 0 or 1) in a period where a value of an output data bit "Q" does not change. Because the redundant transition of the clock bar signal CKb is prevented in the period where the value of the output data bit "Q" does not change, the dynamic power consumption of the flip-flop 100 may decrease.

The first latch 120 may be a positive latch, and the second latch 130 may be a negative latch. For example, the first latch 120 may hold (or latch) the input data bit "D" when the value of the clock signal CK is "1" and may output a signal for outputting the output data bit "Q" when the value of the clock signal CK is "0". The second latch 130 may hold (or latch) the input data bit "D" when the value of the clock signal CK is "0" and may output a signal for outputting the output data bit "Q" when the value of the clock signal CK is "1".

The output multiplexer 140 may output one of the input data bit latched by the first latch 120 and the input data bit latched by the second latch 130 as the output data bit "Q". The output multiplexer 140 may share a node with the first latch 120, and may share a node with the second latch 130. That is, the output multiplexer 140 may operate based on a value of the node of the first latch 120 and a value of the node of the second latch 130, in addition to the data bits latched by the first latch 120 and the second latch 130. Accordingly, the number of transistors constituting the output multiplexer 140 may decrease.

Figure 3:
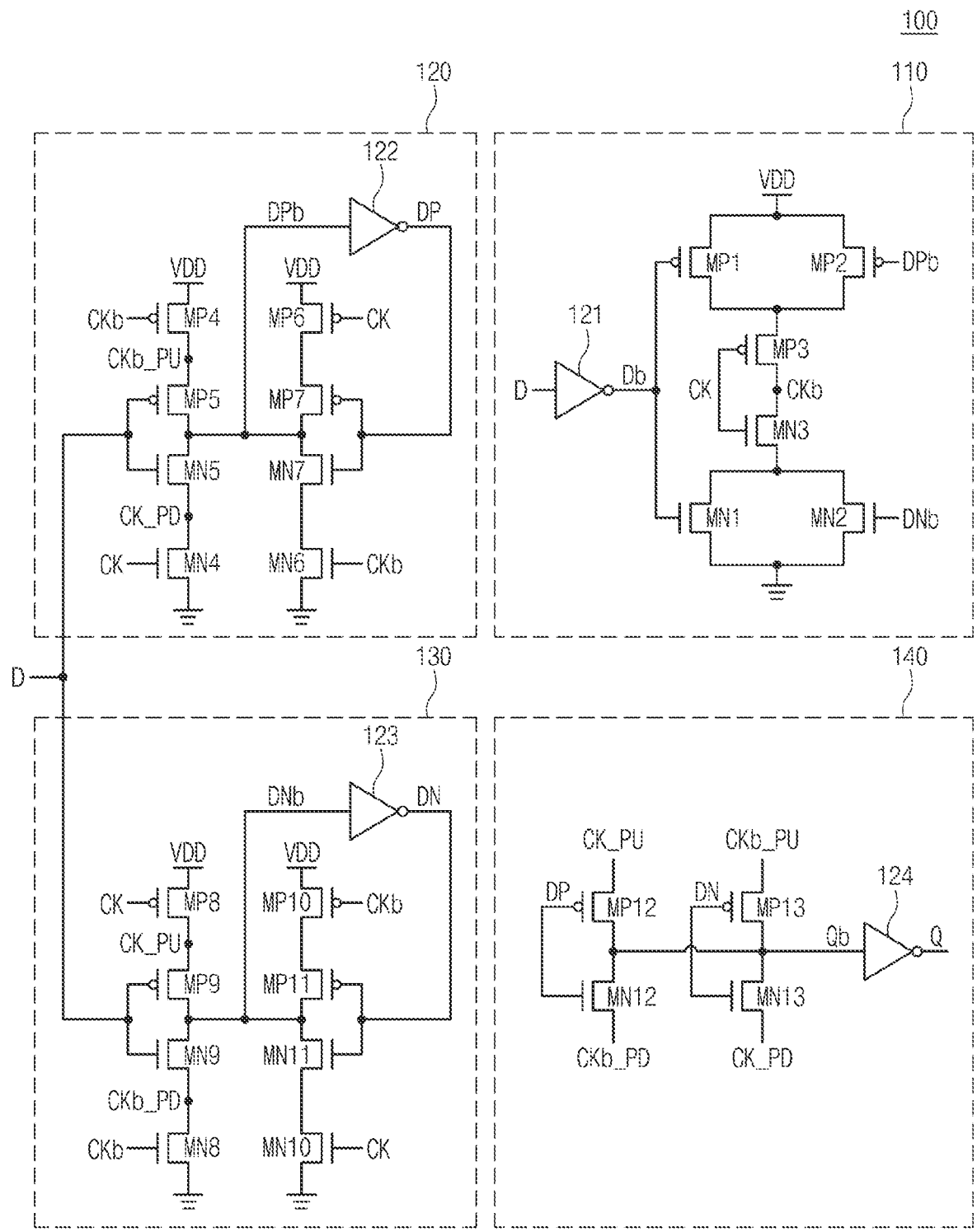
FIG. 3 is a circuit diagram of a flip-flop of FIG. 2.

FIG. 3 illustrates a flip-flop of FIG. 2. The input logic circuit 110 may include a first inverter 121, a first positive-channel metal-oxide semiconductor (PMOS) transistor MP1, a second PMOS transistor MP2, a third PMOS transistor MP3, a first negative-channel metal-oxide semiconductor (NMOS) transistor MN1, a second NMOS transistor MN2, and a third NMOS transistor MN3.

The first inverter 121 may receive and invert the input data bit "D" and may output an inverted input data bit Db.

The first latch 120 and the second latch 130 may be based on a clocked complementary metal-oxide semiconductor (C2MOS) circuit. The C2MOS circuit may have a structure where two PMOS transistors and two NMOS transistors are connected in series as illustrated in FIG. 3, without limitation thereto.

The first PMOS transistor MP1 and the second PMOS transistor MP2 may be connected in parallel between a node to which a power supply voltage VDD is supplied and a source electrode of the third PMOS transistor MP3. The first NMOS transistor MN1 and the second NMOS transistor MN2 may be connected in parallel between a node to which a ground voltage is provided and a source electrode of the third NMOS transistor MN3. A drain electrode of the third PMOS transistor MP3 may be connected with a drain electrode of the third NMOS transistor MN3.

The first PMOS transistor MP1 and the first NMOS transistor MN1 may be turned on or turned off in response to the inverted input data bit Db. The second PMOS transistor MP2 may be turned on or turned off in response to a signal DPb latched by the first latch 120. The second NMOS transistor MN2 may be turned on or turned off in response to a signal DNb latched by the second latch 130. The third PMOS transistor MP3 and the third NMOS transistor MN3 may be turned on or turned off in response to the clock signal CK. Herein, the clock bar signal CKb may be output from a node where the drain electrode of the third PMOS transistor MP3 and the drain electrode of the third NMOS transistor MN3 are in contact with each other.

The first latch 120 and the second latch 130 may be based on the C2MOS circuit structure. The first latch 120 may include a first C2MOS circuit that may include a fourth PMOS transistor MP4, a fifth PMOS transistor MP5, a fifth NMOS transistor MN5, and a fourth NMOS transistor MN4, and a second C2MOS circuit that may include a sixth PMOS transistor MP6, a seventh PMOS transistor MP7, a seventh NMOS transistor MN7, and a sixth NMOS transistor MN6. A first input terminal of the first C2MOS circuit may receive the input data bit "D", and the remaining two input terminals thereof may receive the clock signal CK and the clock bar signal CKb. An output terminal of the first C2MOS circuit (e.g., a node between the fifth PMOS transistor MP5 and the fifth NMOS transistor MN5) and an output terminal of the second C2MOS circuit (e.g., a node between the seventh PMOS transistor MP7 and the seventh NMOS transistor MN7) may be connected with an input terminal of a second inverter 122. A first input terminal of the second C2MOS circuit may receive an output signal DP of the second inverter 122, and the remaining two input terminals thereof may receive the clock signal CK and the clock bar signal CKb. The second latch 130 may have the same structure as the first latch 120.

The fourth PMOS transistor MP4, the fifth PMOS transistor MP5, the fifth NMOS transistor MN5, and the fourth NMOS transistor MN4 may be connected in series between the node provided with the power supply voltage VDD and the node provided with the ground voltage. The fourth PMOS transistor MP4 may be turned on or turned off in response to the clock bar signal CKb output from the input logic circuit 110. The fifth PMOS transistor MP5 and the fifth NMOS transistor MN5 may be turned on or turned off in response to the input data bit "D". The fourth NMOS transistor MN4 may be turned on or turned off in response to the clock signal CK received from the outside.

As in the above description, the sixth PMOS transistor MP6, the seventh PMOS transistor MP7, the seventh NMOS transistor MN7, and the sixth NMOS transistor MN6 may be connected in series between the node provided with the power supply voltage VDD and the node provided with the ground voltage. The sixth PMOS transistor MP6 may be turned on or turned off in response to the clock signal CK. The seventh PMOS transistor MP7 and the seventh NMOS transistor MN7 may be turned on or turned off in response to the output signal DP from the second inverter 122. The sixth NMOS transistor MN6 may be turned on or turned off in response to the clock bar signal CKb from the input logic circuit 110.

The second inverter 122 may receive the signal DPb of the node that is connected in common with a drain electrode of the fifth PMOS transistor MP5, a drain electrode of the fifth NMOS transistor MN5, a drain electrode of the seventh PMOS transistor MP7, and a drain electrode of the seventh NMOS transistor MN7. The second inverter 122 may invert the signal DPb and may output the signal DP.

An eighth PMOS transistor MP8, a ninth PMOS transistor MP9, a ninth NMOS transistor MN9, and an eighth NMOS transistor MN8 may be connected in series between the node provided with the power supply voltage VDD and the node provided with the ground voltage. The eighth PMOS transistor MP8 may be turned on or turned off in response to the clock signal CK from the outside. The ninth PMOS transistor MP9 and the ninth NMOS transistor MN9 may be turned on or turned off in response to the input data bit "D" The eighth NMOS transistor MN8 may be turned on or turned off in response to the clock bar signal CKb from the input logic circuit 110.

A tenth PMOS transistor MP10, an eleventh PMOS transistor MP11, an eleventh NMOS transistor MN11, and a tenth NMOS transistor MN10 may be connected in series between the node provided with the power supply voltage VDD and the node provided with the ground voltage. The tenth PMOS transistor MP10 may be turned on or turned off in response to the clock bar signal CKb. The eleventh PMOS transistor MP11 and the eleventh NMOS transistor MN11 may be turned on or turned off in response to a signal DN from a third inverter 123. The tenth NMOS transistor MN10 may be turned on or turned off in response to the clock signal CK.

The third inverter 123 may receive the signal DNb of the node that is connected in common with a drain electrode of the ninth PMOS transistor MP9, a drain electrode of the ninth NMOS transistor MN9, a drain electrode of the eleventh PMOS transistor MP11, and a drain electrode of the eleventh NMOS transistor MN11. The third inverter 123 may invert the signal DNb and may output the signal DN.

The output multiplexer 140 may be based on CMOS. A first CMOS may receive an output signal of the second inverter 122, and a second CMOS may receive an output signal of the third inverter 123. An output terminal of the first CMOS (e.g., a node between a twelfth PMOS transistor MP12 and a twelfth NMOS transistor MN12) and an output terminal of the second CMOS (e.g., a node between a thirteenth PMOS transistor MP13 and a thirteenth NMOS transistor MN13) may be connected with an input terminal of a fourth inverter 124.

The twelfth PMOS transistor MP12 may be connected between an internal node of the second latch 130, which outputs a signal CK_PU, and the input terminal of the fourth inverter 124. The twelfth NMOS transistor MN12 may be connected between an internal node of the second latch 130, which outputs a signal CKb_PD, and the input terminal of the fourth inverter 124. The twelfth PMOS transistor MP12 and the twelfth NMOS transistor MN12 may be turned on or turned off in response to the inverse signal DP of the signal DPb, where the signal DPb is latched by the first latch 120.

The thirteenth PMOS transistor MP13 may be connected between an internal node of the first latch 120, which outputs a signal CKb_PU, and the input terminal of the fourth inverter 124. The thirteenth NMOS transistor MN13 may be connected between an internal node of the first latch 120, which outputs a signal CK_PD, and the input terminal of the fourth inverter 124. The thirteenth PMOS transistor MP13 and the thirteenth NMOS transistor MN13 may be turned on or turned off in response to the inverse signal DN of the signal DNb, where the signal DNb is latched by the second latch 130.

The fourth inverter 124 may receive a signal Qb of the node that is connected in common with a drain electrode of the twelfth PMOS transistor MP12, a drain electrode of the twelfth NMOS transistor MN12, a drain electrode of the thirteenth PMOS transistor MP13, and a drain electrode of the thirteenth NMOS transistor MN13. The fourth inverter 124 may invert the signal Qb and may output the output data bit "Q".

FIG. 4 illustrates a table of values of the clock bar signal CKb according to the clock signal CK and the input data bit "D" input to a flip-flop of FIG. 3, the signal DPb latched by a first latch, and the signal DNb latched by a second latch. A figure number corresponding to each state is shown together with the table.

Referring to FIGS. 3 and 4, the number of states that are determined depending on the clock signal CK, the input data bit "D", the signal DPb, and the signal DNb may be "16". The clock bar signal CKb may have three values. In the table, "X" represents a floating state, and the floating state refers to a state where a flip-flop is capable of operating normally regardless of a value of the clock bar signal CKb. In other words, in the floating state, the clock bar signal CKb may maintain a value of a previous state without the redundant transition of the clock bar signal CKb, and thus, the dynamic power may decrease. An operation of the flip-flop 100 according to each state illustrated in FIG. 4 will be described in detail with reference to FIG. 6.

Figure 5:
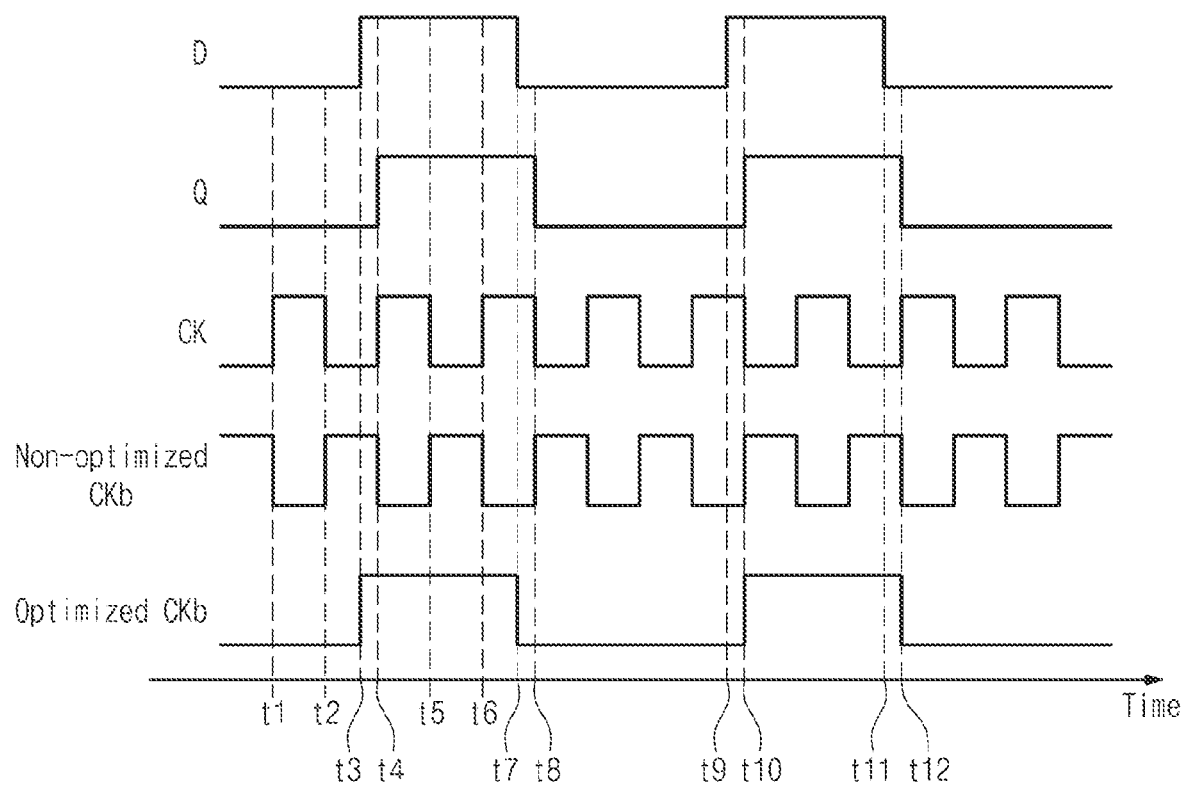
FIG. 5 is a signal diagram illustrating waveforms of an input data bit and a clock signal input to a flip-flop according to an embodiment of the present disclosure and waveforms of a clock bar signal and an output data bit according to the input data bit and the clock signal.

FIG. 5 illustrates waveforms of the input data bit "D" and the clock signal CK input to a flip-flop according to an embodiment of the present disclosure and waveforms of the clock bar signal CKb and the output data bit "Q" according to the input data bit "D" and the clock signal CK. For comparison, the waveform of the non-optimized clock bar signal CKb generated by the non-optimized flip-flop illustrated in FIG. 1 is illustrated as an example, as is the waveform of an optimized clock bar signal CKb generated by an optimized flip-flop embodiment of the present disclosure.

Figure 6:
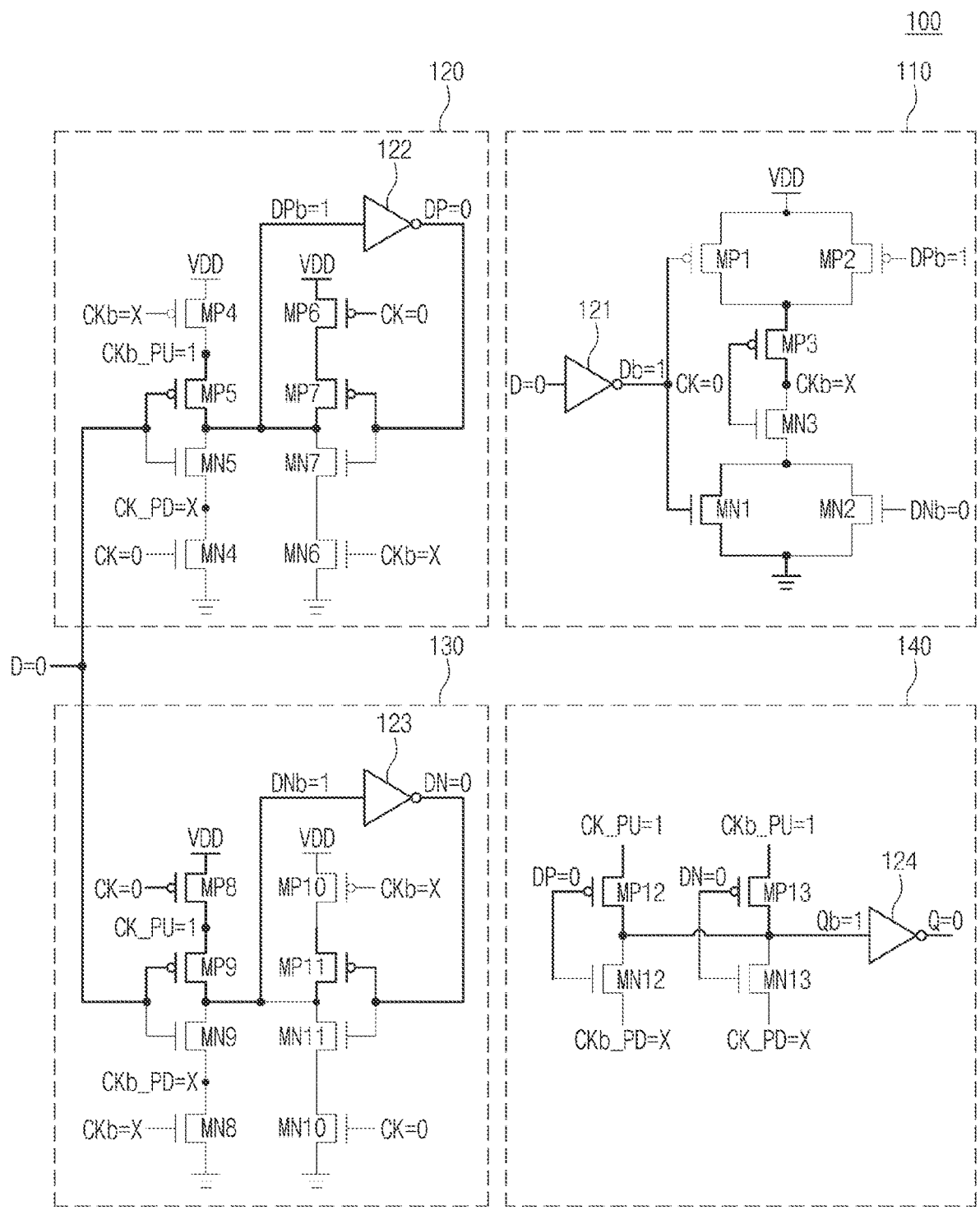
FIGS. 6 and 7 are circuit diagrams illustrating operation states of a flip-flop at a point in time t1 of FIG. 5.
Figure 7:
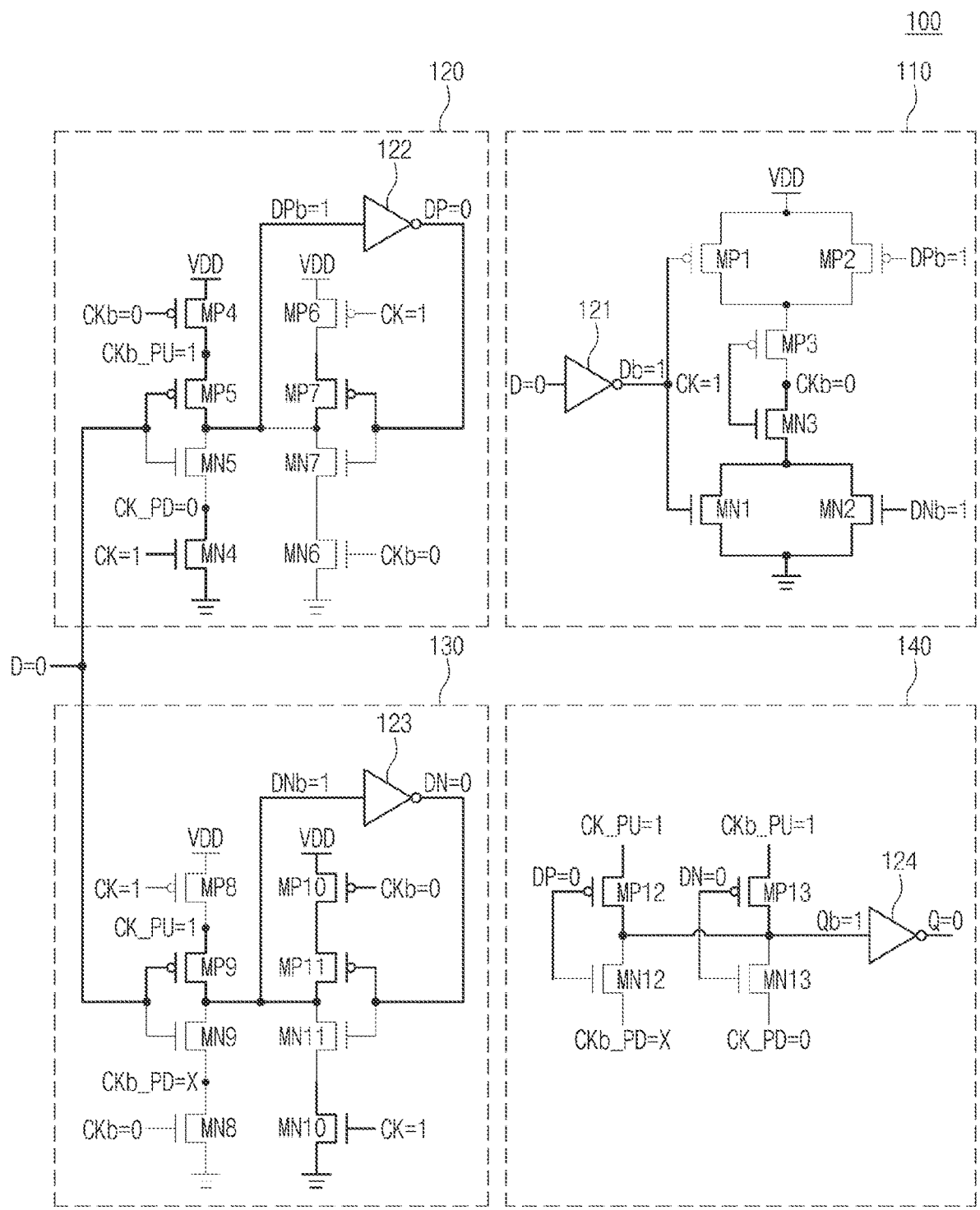

FIGS. 6 and 7 illustrate operation states of a flip-flop, such as that of FIG. 3 without limitation thereto, at a point in time t1 in FIG. 5. Substantially duplicate description may be omitted. FIGS. 6-21 may show activated circuitry in bold, without limitation thereto.

In detail, the point in time t1 indicates the point in time when the value of the clock signal CK transitions from the voltage level corresponding to the logical value of "0", which may be any actual voltage level without limitation, to the voltage level corresponding to the logical value of "1", which may be any other actual voltage level without limitation, while the value of the output data bit "Q" maintains the voltage level corresponding to the logical value of "0". The flip-flop 100 may have state #4 of FIG. 6 immediately before the value of the clock signal CK changes from "0" to "1". The flip-flop 100 may have state #12 of FIG. 7 immediately after the clock signal CK changes from "0" to "1".

As the power supply voltage VDD is applied to the flip-flop 100 in the beginning of the operation of the flip-flop 100, the flip-flop 100 starts to operate; in this case, node voltages of the flip-flop 100 start to increase slowly from "0" along with the power supply voltage VDD. Accordingly, the voltage level of the input terminal of the second inverter 122 also increases slowly to the power supply voltage VDD, and the second inverter 122 inverts the signal DPb having the value of "1" and outputs the signal DP having the value of "0". Because the clock bar signal CKb is fixed to "0", the sixth PMOS transistor MP6 is turned on; in contrast, the clock bar signal CKb increases slowly from the voltage level (hereinafter referred to as "0") corresponding to "0" to any value (e.g., "X") between "0" and the voltage level (hereinafter referred to as "1") corresponding to "1", and then maintains the floating state. Thus, the clock bar signal CKb has the floating state in the beginning of the operation of the flip-flop 100. Herein, the value of the clock bar signal CKb may be a value that is insufficient to turn on the fourth PMOS transistor MP4 and the sixth NMOS transistor MN6. As a result, the clock bar pull-up signal CKb_PU, which may have a value of "1" may be output from the node between the fourth PMOS transistor MP4 and the fifth PMOS transistor MP5 through the fifth PMOS transistor MP5, the sixth PMOS transistor MP6, and the seventh PMOS transistor MP7

In the case of the second latch 130, the eighth PMOS transistor MP8 is turned on by the clock signal CK, which may have a value of "0", and the ninth PMOS transistor MP9 is turned on by the input data bit "D", which may have a value of "0". Accordingly, a value of the signal DNb of the input terminal of the third inverter 123 may be "1" corresponding to the power supply voltage VDD, and the third inverter 123 may invert the signal DNb and may output the signal DN, which may have a value of "0". In this case, the clock pull-up signal CK_PU, which may have a value of "1" corresponding to the power supply voltage VDD may be output from the node between the eighth PMOS transistor MP8 and the ninth PMOS transistor MP9.

In the case of the output multiplexer 140, the twelfth PMOS transistor MP12 may be turned on in response to the signal DP, which may have a value of "0"; in this case, the twelfth PMOS transistor MP12 may receive the clock pull-up signal CK_PU of "1" and may output the signal Qb, which may have a value of "1". The thirteenth PMOS transistor MP13 may be turned on in response to the signal DN, which may have a value of "0"; in this case, the thirteenth PMOS transistor MP13 may receive the clock bar pull-up signal CKb_PU, which may have a value of "1" and may output the signal Qb, which may have a value of "1". The fourth inverter 124 may invert the signal Qb and may output the output data bit "Q", which may have a value of "0".

Referring to FIG. 7, at the point in time t1, because the input data bit "D" maintains "0", the first PMOS transistor MP1 may be turned off by the inverted input data bit Db, and the first NMOS transistor MN1 may be turned on by the inverted input data bit Db. Because the value of the clock signal CK transitions to "1" at the point in time t1, the third PMOS transistor MP3 may be turned off by the clock signal CK, and the third NMOS transistor MN3 may be turned on by the clock signal CK. Accordingly, the clock bar signal CKb, which may have a value of "0" may be output from the node, where the drain electrode of the third PMOS transistor MP3 and the drain electrode of the third NMOS transistor MN3 are in contact with each other.

In the case of the first latch 120, the fourth PMOS transistor MP4 may be turned on by the clock bar signal CKb, which may have a value of "0", and the fifth PMOS transistor MP5 may be turned on by the input data bit "D", which may have a value of "0". The value of the signal DPb may maintain "1" by the power supply voltage VDD, and the second inverter 122 may invert the signal DPb; in this case, the value of the signal DP output from the second inverter 122 may maintain "0". Accordingly, the clock bar pull-up signal CKb_PU, which may have a value of "1" may be output from the node between the fourth PMOS transistor MP4 and the fifth PMOS transistor MP5.

In the case of the output multiplexer 140, the values input to the output multiplexer 140 of FIG. 6 are maintained except for the signal CK_PD, which may have a value of "0". Accordingly, the fourth inverter 124 may output the output data bit "Q", which may have a value of "0".

Comparing the input logic circuits 110 of FIGS. 6 and 7, at the point in time when the clock signal CK transitions "0" to "1", the value of the clock bar signal CKb of the present disclosure changes from the value "X" indicating the floating state to "0" (e.g., need not change substantially). In other words, compared to the case where the value of the non-optimized clock bar signal CKb changes from "1" to "0", a level change of the clock bar signal CKb of the present disclosure may be smaller, or the value of the clock bar signal CKb of the present disclosure need not change; in this case, the dynamic power consumption according to the level change of the clock bar signal CKb may decrease.

An operation state of the flip-flop 100 at a point in time t2 will be described with reference to FIGS. 6 and 7.

The flip-flop 100 may have state #12 of FIG. 7 immediately before the point in time t2. As the value of the clock signal CK transitions from "1" to "0" immediately after the point in time t2, the flip-flop 100 may have state #4 of FIG. 6.

In the case where the input logic circuit 110, when the value of the clock signal CK transitions to "0" in a state where the value of the input data bit "D" maintains "0", the third PMOS transistor MP3 may be turned on by the clock signal CK, and the third NMOS transistor MN3 may be turned off by the clock signal CK. Because the first and second PMOS transistors MP1 and MP2 are turned off by the signals Db and DPb whose values are "1", the clock bar signal CKb may maintain the floating state corresponding to the value "X" of the previous state, that is, state #4.

In the case of the first latch 120 and the second latch 130, the sixth NMOS transistor MN6 and the eighth NMOS transistor MN8 may be turned on or turned off by the clock bar signal CKb having the value "X" corresponding to the floating state. However, the seventh NMOS transistor MN7 may be turned off by the output signal DP of the second inverter 122, which has a value of "0"; in this case, because the value of the signal DPb of the input terminal of the second inverter 122 is "1" and the value of the output signal DP of the second inverter 122 is "0", the value of the clock bar pull-up signal CKb_PU may be "1". The ninth NMOS transistor MN9 is turned off by the signal "D", which may have a value of "0"; in this case, because the value of the signal DNb of the input terminal of the third inverter 123 is "1" and the value of the output signal DN of the third inverter 123 is "0", the value of the clock pull-up signal CK_PU may be "1".

According to the above description, even though the value of the clock signal CK transitions from "1" to "0" in a state where the value of the input data bit "D" maintains "0", the value of the clock bar signal CKb, which corresponds to the floating state X determined in the previous state, that is, state #12, may be maintained. Accordingly, unnecessary power consumption due to the redundant transition may be suppressed.

Figure 8:
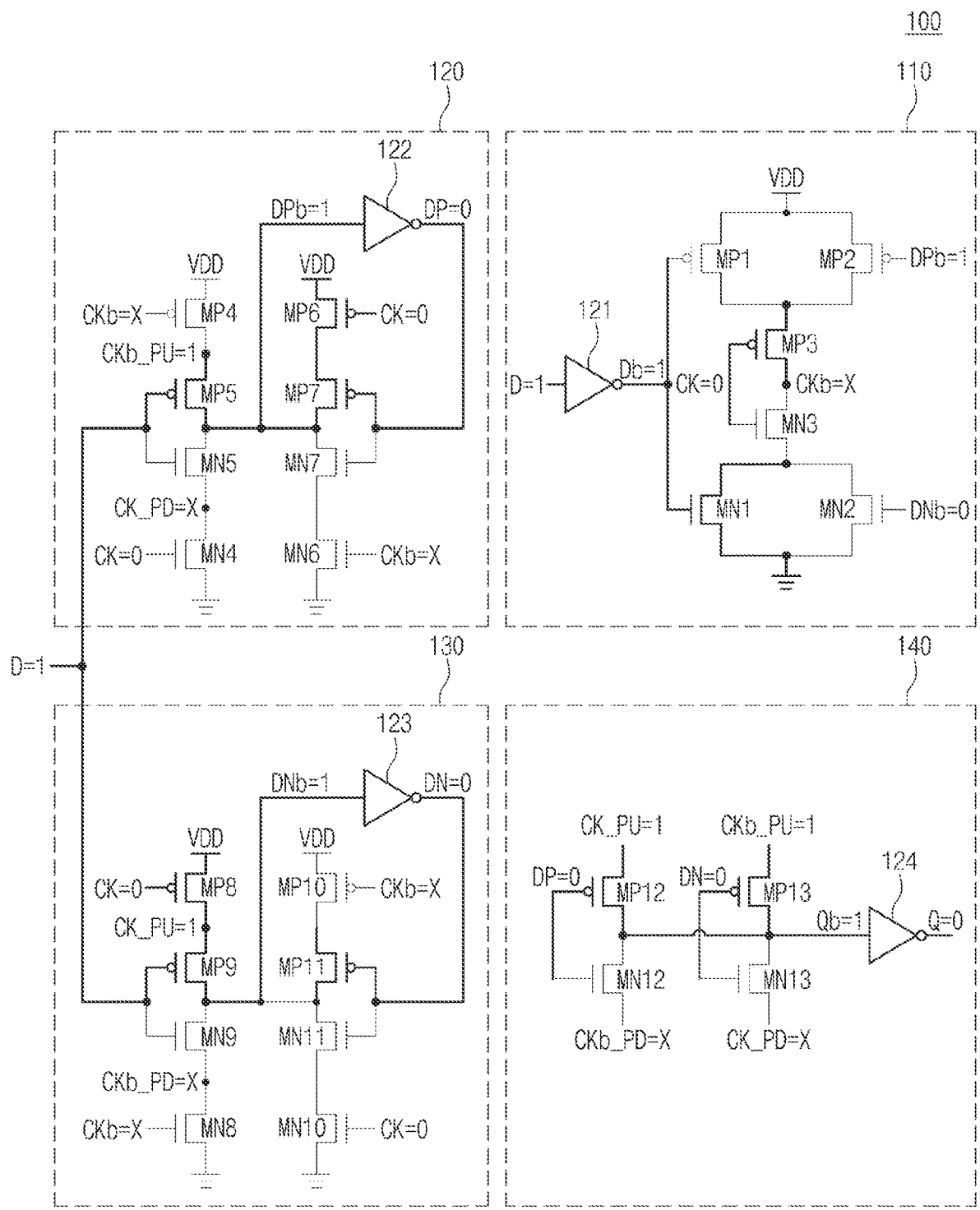
FIGS. 8 and 9 are circuit diagrams illustrating operation states of a flip-flop at a point in time t3 of FIG. 5.
Figure 9:
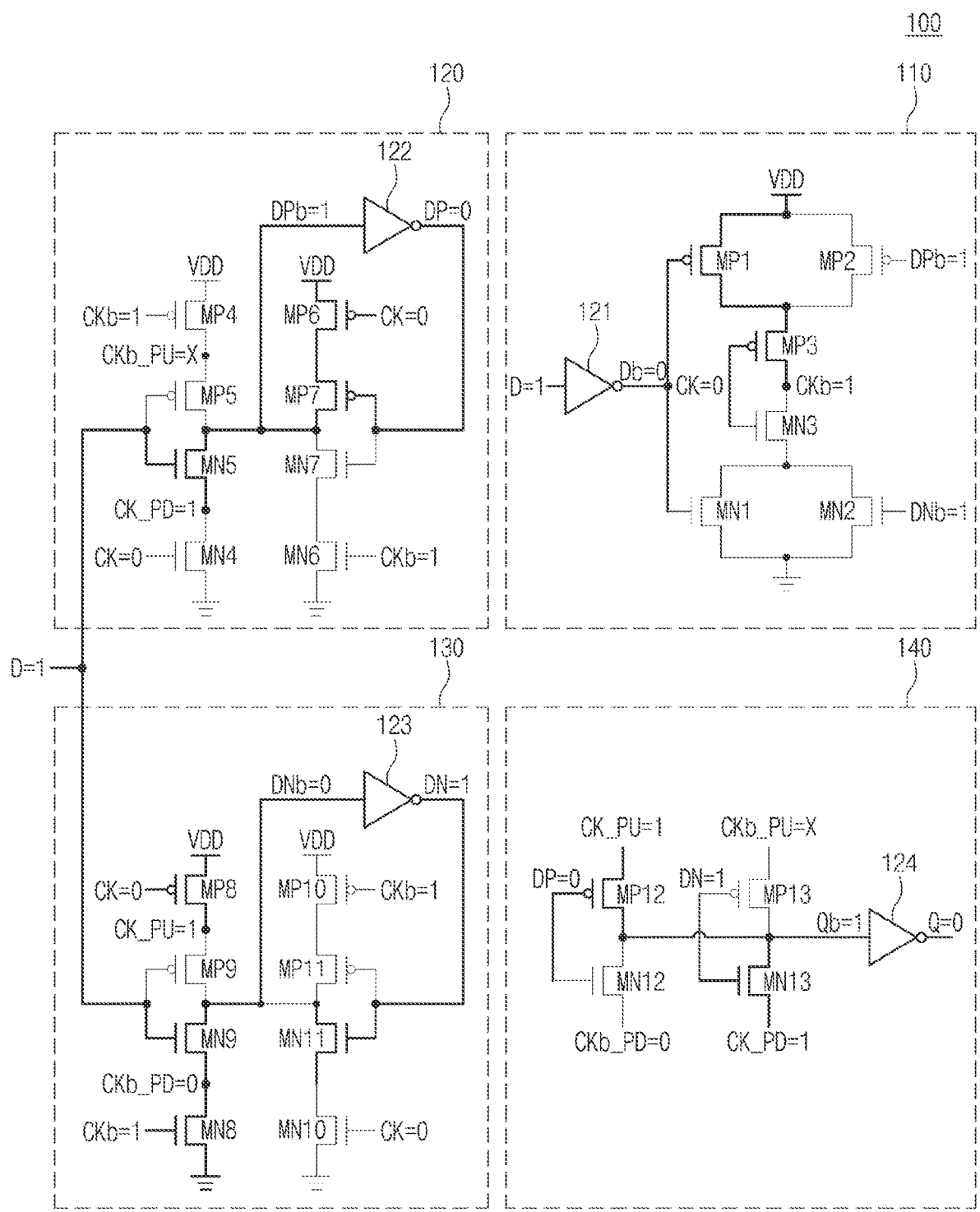

FIGS. 8 and 9 illustrate operation states of a flip-flop at a point in time t3 of FIG. 5. Substantially duplicate description may be omitted.

In detail, the point in time t3 indicates a point in time when the value of the input data bit "D" transitions from "0" to "1" while the clock signal CK maintains the value of "0". The flip-flop 100 may have state #4 of FIG. 6 immediately before the input data bit "D" changes from "0" to "1". The flip-flop 100 may have state #8 of FIG. 8 at the moment when the input data bit "D" changes from "0" to "1". The flip-flop 100 may have state #7 of FIG. 9 immediately after the input data bit "D" transitions from "0" to "1".

Referring to FIG. 8, the flip-flop 100 may receive the input data bit "D" of "1" in a state where the values illustrated in FIG. 6 are maintained.

Afterwards, referring to FIG. 9, in the case of the input logic circuit 110, because the value of the inverted input data bit Db is "0", the first PMOS transistor MP1 is turned on, and the first NMOS transistor MN1 is turned off. Because the value of the clock signal CK is "0", the third PMOS transistor MP3 is turned on, and the third NMOS transistor MN3 is turned off. Accordingly, the clock bar signal CKb, which may have a value of "1" may be output from the node between the third PMOS transistor MP3 and the third NMOS transistor MN3.

In the case of the first latch 120, the fourth PMOS transistor MP4 may be turned off by the clock bar signal CKb, which may have a value of "1", and the fifth PMOS transistor MP5 may also be turned off by the input data bit "D", which may have a value of "1". Accordingly, the node between the fourth PMOS transistor MP4 and the fifth PMOS transistor MP5 is set to the floating state where the value of the previous state (e.g., state #8 of FIG. 8) is maintained, and the clock bar pull-up signal CKb_PU, which may have a value of "X" may be output.

The fourth NMOS transistor MN4 may be turned off by the clock signal CK, which may have a value of "0", and the fifth NMOS transistor MN5 may be turned on by the input data bit "D", which may have a value of "1". By the values (e.g., "1" and "0") of the input and output terminals of the second inverter 122 maintained in the previous state (e.g., state #8 of FIG. 8), the clock pull-down signal CK_PD, which may have a value of "1" may be output from the node between the fifth NMOS transistor MN5 and the fourth NMOS transistor MN4.

In the case of the second latch 130, the eighth PMOS transistor MP8 may be turned on by the clock signal CK, which may have a value of "0", and the ninth PMOS transistor MP9 may be turned on by the input data bit "D", which may have a value of "1". Accordingly, the clock pull-up signal CK_PU, which may have a value of "1" corresponding to the power supply voltage VDD may be output from the node between the eighth PMOS transistor MP8 and the ninth PMOS transistor MP9.

The eighth NMOS transistor MN8 may be turned on by the clock bar signal CKb, which may have a value of "1", and the ninth NMOS transistor MN9 may be turned on by the input data bit "D", which may have a value of "1". By the value (e.g., "0") of the input terminal of the third inverter 123 maintained in the previous state (e.g., state #8 of FIG. 8) and the ground voltage, the clock bar pull-down signal CKb_PD, which may have a value of "0" may be output from the node between the eighth NMOS transistor MN8 and the ninth NMOS transistor MN9.

In the case of the output multiplexer 140, the twelfth PMOS transistor MP12 may be turned on in response to the signal DP; in this case, the twelfth PMOS transistor MP12 may receive the clock pull-up signal CK_PU and may output the signal Qb, which may have a value of "1". The thirteenth NMOS transistor MN13 may be turned on in response to the signal DN; in this case, the thirteenth NMOS transistor MN13 may receive the clock pull-down signal CK_PD and may output the signal Qb, which may have a value of "1". The fourth inverter 124 may invert the signal Qb and may output the output data bit "Q", which may have a value of "0".

Figure 10:
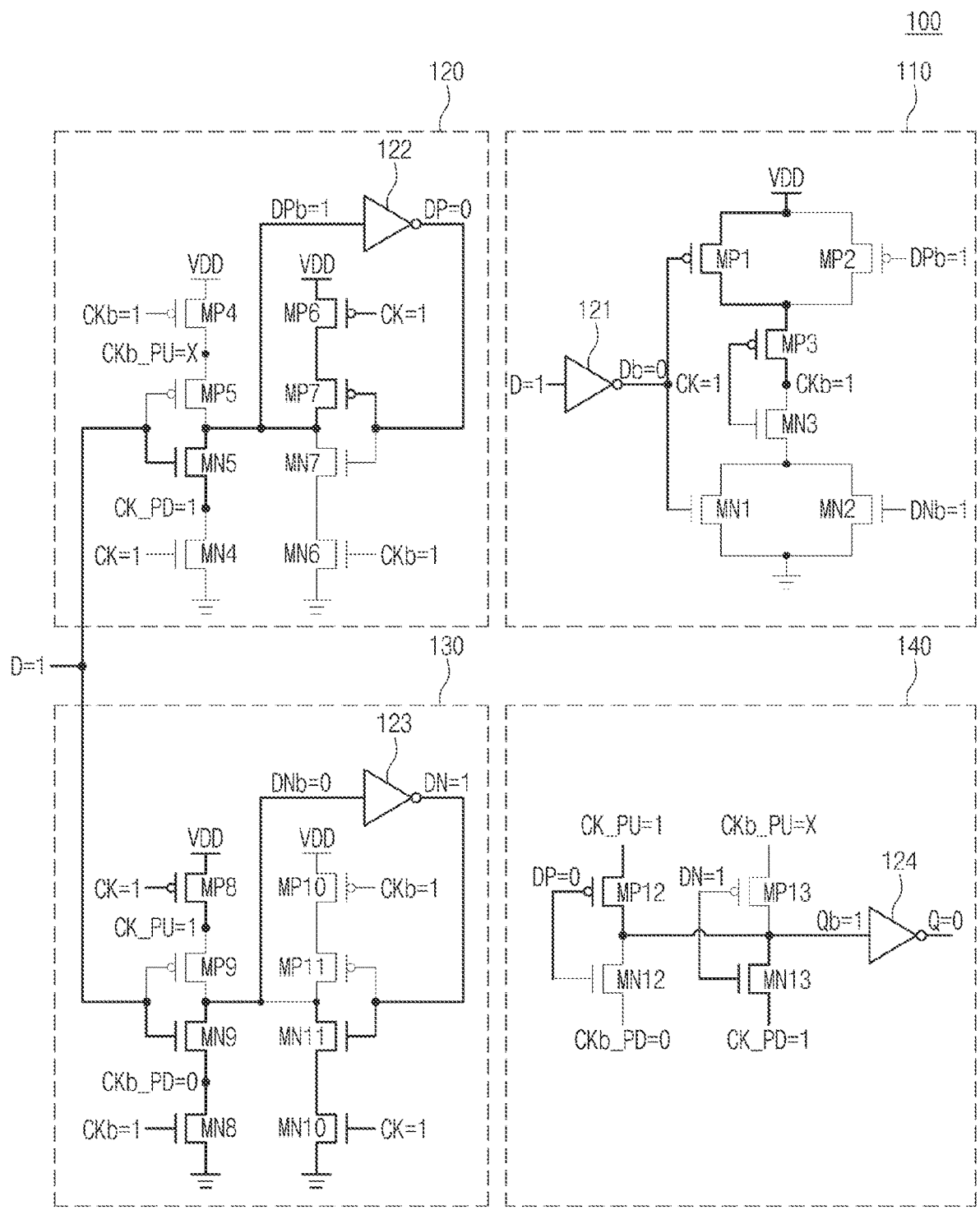
FIGS. 10 and 11 are circuit diagrams illustrating operation states of a flip-flop at a point in time t4 of FIG. 5.
Figure 11:
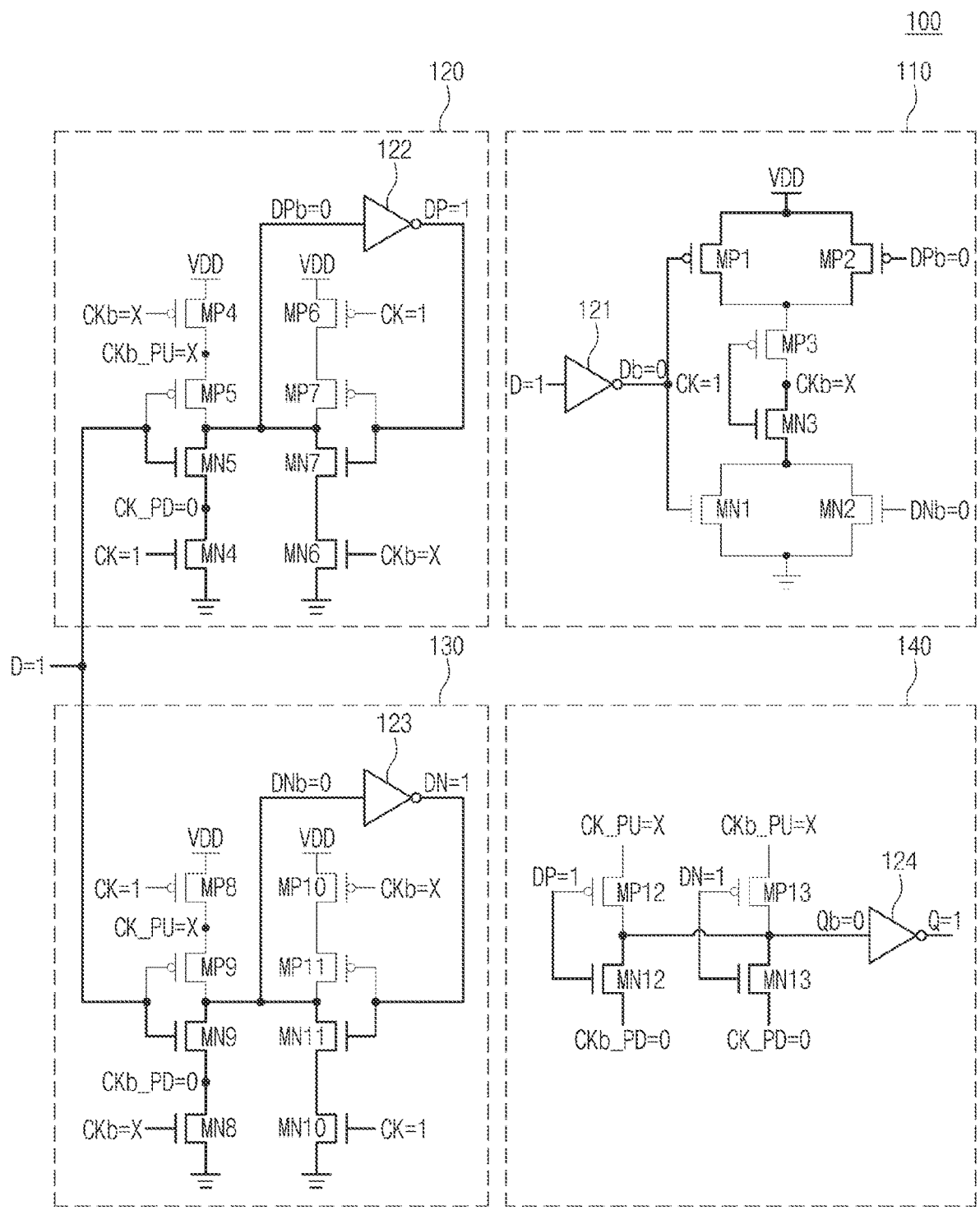

FIGS. 10 and 11 illustrate operation states of a flip-flop at a point in time t4 of FIG. 4. In detail, the point in time t4 indicates a point in time when the value of the clock signal "CK" transitions from "0" to "1" while the input data bit "D" maintains the value of "1". The flip-flop 100 may have state #7 of FIG. 9 immediately before the clock signal CK changes from "0" to "1". The flip-flop 100 may have state #15 of FIG. 10 at the moment when the clock signal CK changes from "0" to "1". The flip-flop 100 may have state #13 of FIG. 11 immediately after the clock signal CK transitions from "1" to "0".

First, the flip-flop 100 maintains the state of FIG. 9 immediately before the point in time t4 and then receives the clock signal CK, which may have a value of "1" at the point in time t4. Because the moment when the clock signal CK, which may have a value of "1" is received is illustrated in FIG. 10, FIG. 10 shows the flip-flop 100 where the previous state (e.g., state #7 of FIG. 9) is maintained except for the value of the clock signal CK.

Afterwards, referring to FIG. 11, in the case of the input logic circuit 110, because the value of the inverted input data bit Db is "0", the first PMOS transistor MP1 is turned on, and the first NMOS transistor MN1 is turned off. Because the value of the clock signal CK is "1", the third PMOS transistor MP3 is turned off, and the third NMOS transistor MN3 is turned on. Accordingly, the node between the third PMOS transistor MP3 and the third NMOS transistor MN3 may be set to the floating state; in this case, the clock bar signal CKb, which may have a value of "X" may be output from the node. Herein, because the node maintains the previous state (e.g., state #15 of FIG. 10), the value of "X" may substantially correspond to "1". That is, the value of the clock bar signal CKb need not be changed substantially.

In the case of the first latch 120, the fourth PMOS transistor MP4 may be turned off of turned on by the clock bar signal CKb, which may have a value of "X", and the fifth PMOS transistor MP5 may be turned off by the input data bit "D", which may have a value of "1". Accordingly, the node between the fourth PMOS transistor MP4 and the fifth PMOS transistor MP5 is set to the floating state where the value of the previous state (e.g., state #15 of FIG. 10) is maintained, and the clock bar pull-up signal CKb_PU, which may have a value of "X" may be output.

The fourth NMOS transistor MN4 may be turned on by the clock signal CK, which may have a value of "1", and the fifth NMOS transistor MN5 may be turned on by the input data bit "D", which may have a value of "1". Accordingly, the clock pull-down signal CK_PD, which may have a value of "0" may be output from the node between the fifth NMOS transistor MN5 and the fourth NMOS transistor MN4, and the signal DPb, which may have a value of "0" may be input to the second inverter 122; in this case, the second inverter 122 may output the signal DP, which may have a value of "1".

In the case of the second latch 130, the eighth PMOS transistor MP8 may be turned off by the clock signal CK, which may have a value of "1", and the ninth PMOS transistor MP9 may be turned off by the input data bit "D", which may have a value of "1". Accordingly, the node between the eighth PMOS transistor MP8 and the ninth PMOS transistor MP9 may be set to the floating state; in this case, the value of the clock pull-up signal CK_PU may substantially correspond to the previous state (e.g., state #15 of FIG. 10), such as X="1".

The eighth NMOS transistor MN8 may be in a turn-on state or a turn-off state by the clock bar signal CKb, which may have a value of "X", and the ninth NMOS transistor MN9 may be turned on by the input data bit "D", which may have a value of "1". Accordingly, the signal DNb that stably maintains "0" being the previous value may be input to the third inverter 123, and the third inverter 123 may output the signal DN, which may have a value of "1". Because the eleventh NMOS transistor MN11 is turned on by the signal DN and the tenth NMOS transistor MN10 is turned on by the clock signal CK, the value of the input terminal of the third inverter 123 is maintained at "0". Accordingly, the clock bar pull-down signal CKb_PD, which may have a value of "0" may be output from the node between the eighth NMOS transistor MN8 and the ninth NMOS transistor MN9.

In the case of the output multiplexer 140, the twelfth NMOS transistor MN12 may be turned on in response to the signal DP; in this case, the twelfth PMOS transistor MP12 may receive the clock bar pull-down signal CKb_PD and may output the signal Qb, which may have a value of "0". The thirteenth NMOS transistor MN13 may be turned on in response to the signal DN; in this case, the thirteenth NMOS transistor MN13 may receive the clock pull-down signal CK_PD and may output the signal Qb, which may have a value of "0". The fourth inverter 124 may invert the signal Qb and may output the output data bit "Q", which may have a value of "1".

According to the above description, even though the value of the clock signal CK transitions from "0" to "1" in a state where the value of the output data bit "Q" maintains "1", the value of the clock bar signal CKb that corresponds to the floating state need not affect the operation. Also, because the value of the clock bar signal CKb need not change substantially, unnecessary power consumption due to the redundant transition may be suppressed.

Figure 12:
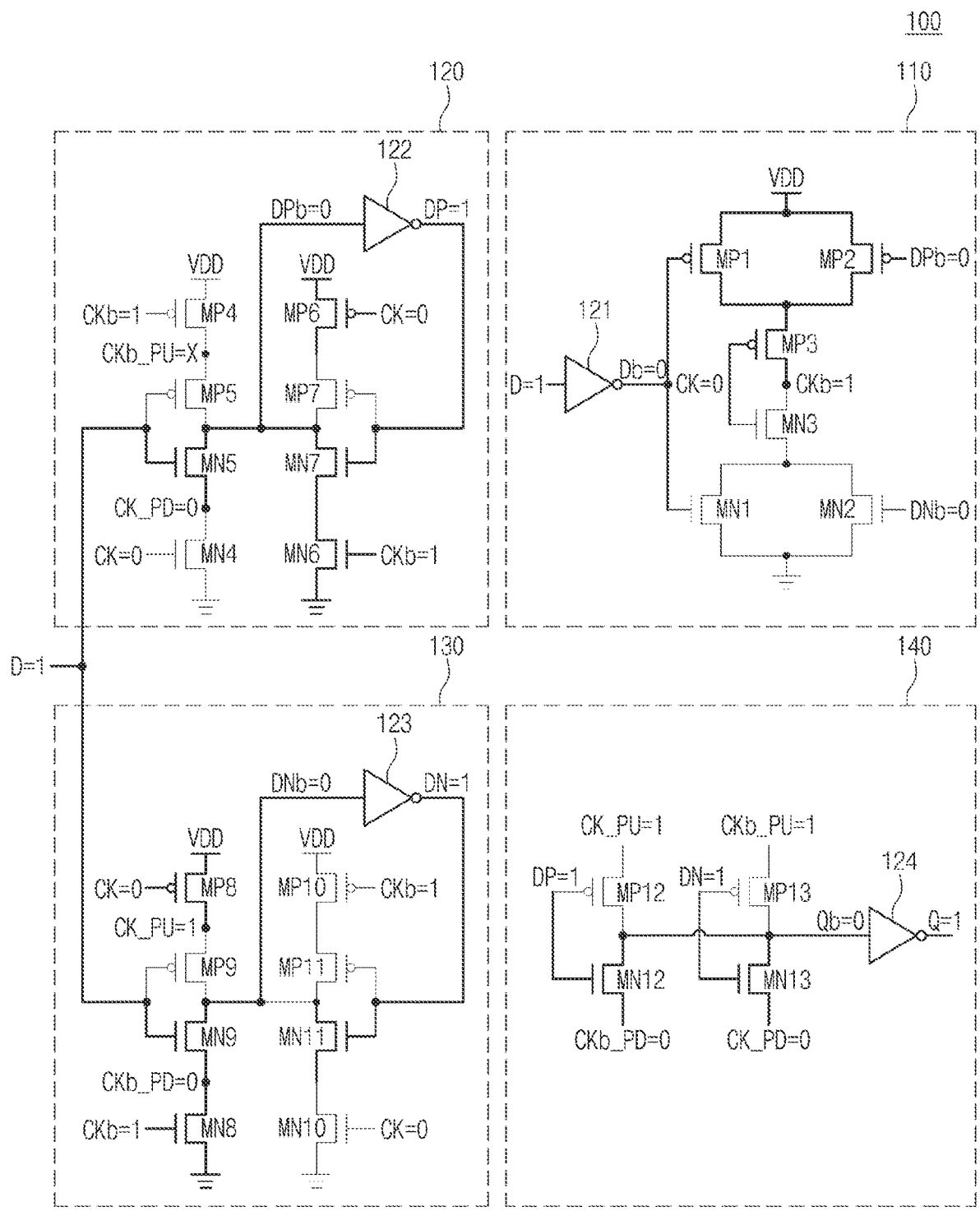
FIG. 12 is a circuit diagram illustrating an operation state of a flip-flop at a point in time t5 of FIG. 5.

FIG. 12 illustrates an operation state of a flip-flop at a point in time t5 of FIG. 5. In detail, the point in time t5 indicates a point in time when the value of the clock signal "CK" transitions from "1" to "0" while the input data bit "D" maintains the value of "1". The flip-flop 100 may have state #13 of FIG. 11 immediately before the clock signal CK changes from "1" to "0". The flip-flop 100 may have state #5 of FIG. 12 immediately after the clock signal CK changes from "1" to "0".

Referring to FIG. 12, the input logic circuit 110 may receive the clock signal CK, which may have a value of "0" and the input data bit "D", which may have a value of "1". Accordingly, the first PMOS transistor MP1 may be turned on by the inverted input data bit Db, and the first NMOS transistor MN1 may be turned off by the inverted input data bit Db. The third PMOS transistor MP3 may be turned on by the clock signal CK, and the third NMOS transistor MN3 may be turned off by the clock signal CK. In this case, the clock bar signal CKb, which may have a value of "1" corresponding to the power supply voltage VDD may be output from the node between the third PMOS transistor MP3 and the third NMOS transistor MN3.

In the case of the first latch 120, the fourth PMOS transistor may be turned off by the clock bar signal CKb, which may have a value of "1", and the fifth PMOS transistor MP5 may be turned off by the input data bit "D", which may have a value of "1". Accordingly, the node between the fourth PMOS transistor MP4 and the fifth PMOS transistor MP5 is set to the floating state where the value of the previous state (e.g., state #13 of FIG. 11) is maintained (e.g., X=1), and the clock bar pull-up signal CKb_PU, which may have a value of "X" may be output.

The fifth NMOS transistor MN5 may be turned on by the input data bit "D", which may have a value of "1", and the sixth NMOS transistor MN6 may be turned on by the clock bar signal CKb, which may have a value of "1". Accordingly, the signal DPb of the input terminal of the second inverter 122 may maintain the value of "0", and the signal DP of the output terminal of the second inverter 122 may maintain the value of "1". In this case, the clock pull-down signal CK_PD, which may have a value of "0" may be output from the node between the fourth NMOS transistor MN4 and the fifth NMOS transistor MN5.

In the case of the second latch 130, the eighth PMOS transistor MP8 may be turned on by the clock signal CK, which may have a value of "0", and the ninth PMOS transistor MP9 may be turned off by the input data bit "D", which may have a value of "1". Accordingly, the clock pull-up signal CK_PU, which may have a value of "1" corresponding to the power supply voltage VDD may be output from the node between the eighth PMOS transistor MP8 and the ninth PMOS transistor MP9.

The ninth NMOS transistor MN9 may be turned on by the input data bit "D", which may have a value of "1", and the eighth NMOS transistor MN8 may be turned on by the clock bar signal CKb, which may have a value of "1". Accordingly, the signal DNb of the input terminal of the third inverter 123, which has the value of "0", may be output as the clock bar pull-down signal CKb_PD through the node between the eighth NMOS transistor MN8 and the ninth NMOS transistor MN9.

In the case of the output multiplexer 140, the twelfth NMOS transistor MN12 may be turned on in response to the signal DP, which may have a value of "1"; in this case, the twelfth NMOS transistor MN12 may output the clock bar pull-down signal CKb_PD, which may have a value of "0". The thirteenth NMOS transistor MN13 may be turned on in response to the signal DN, which may have a value of "1"; in this case, the thirteenth NMOS transistor MN13 may output the clock pull-down signal CK_PD, which may have a value of "0". The fourth inverter 124 may invert the signal Qb and may output the output data bit "Q", which may have a value of "1".

An operation state of the flip-flop 100 at a point in time t6 will be described with reference to FIGS. 11 and 12.

The flip-flop 100 may have state #5 of FIG. 12 immediately before the point in time t6. As the value of the clock signal CK transitions from "0" to "1" immediately after the point in time t6, the flip-flop 100 may have state #13 of FIG. 11.

A value of each signal according to a signal input/output may substantially correspond to that described with reference to FIG. 11. However, in the case of the clock bar signal CKb of FIG. 11, because the third PMOS transistor MP3, the first NMOS transistor MN1, and the second NMOS transistor MN2 are turned off, the node between the third PMOS transistor MP3 and the third NMOS transistor MN3 may be set to the floating state and may maintain the value (e.g., "1") of the previous state (e.g., state #5 of FIG. 12). Accordingly, the clock bar signal CKb, which may have a value of the value of "X" (e.g., a value substantially corresponding to "1") may be output from the node between the third PMOS transistor MP3 and the third NMOS transistor MN3.

As the operations at the points in time t5 and t6 are described with reference to FIGS. 11 and 12, according to the flip-flop 100 of the present disclosure, even though the clock signal CK toggles while the output data bit "Q" maintains "1", the value of the clock bar signal CKb that corresponds to the floating state need not affect the operation. Also, compared to the previous state, the value of the clock bar signal CKb need not change substantially. Accordingly, unnecessary power consumption due to a redundant transition may be prevented.

Figure 13:
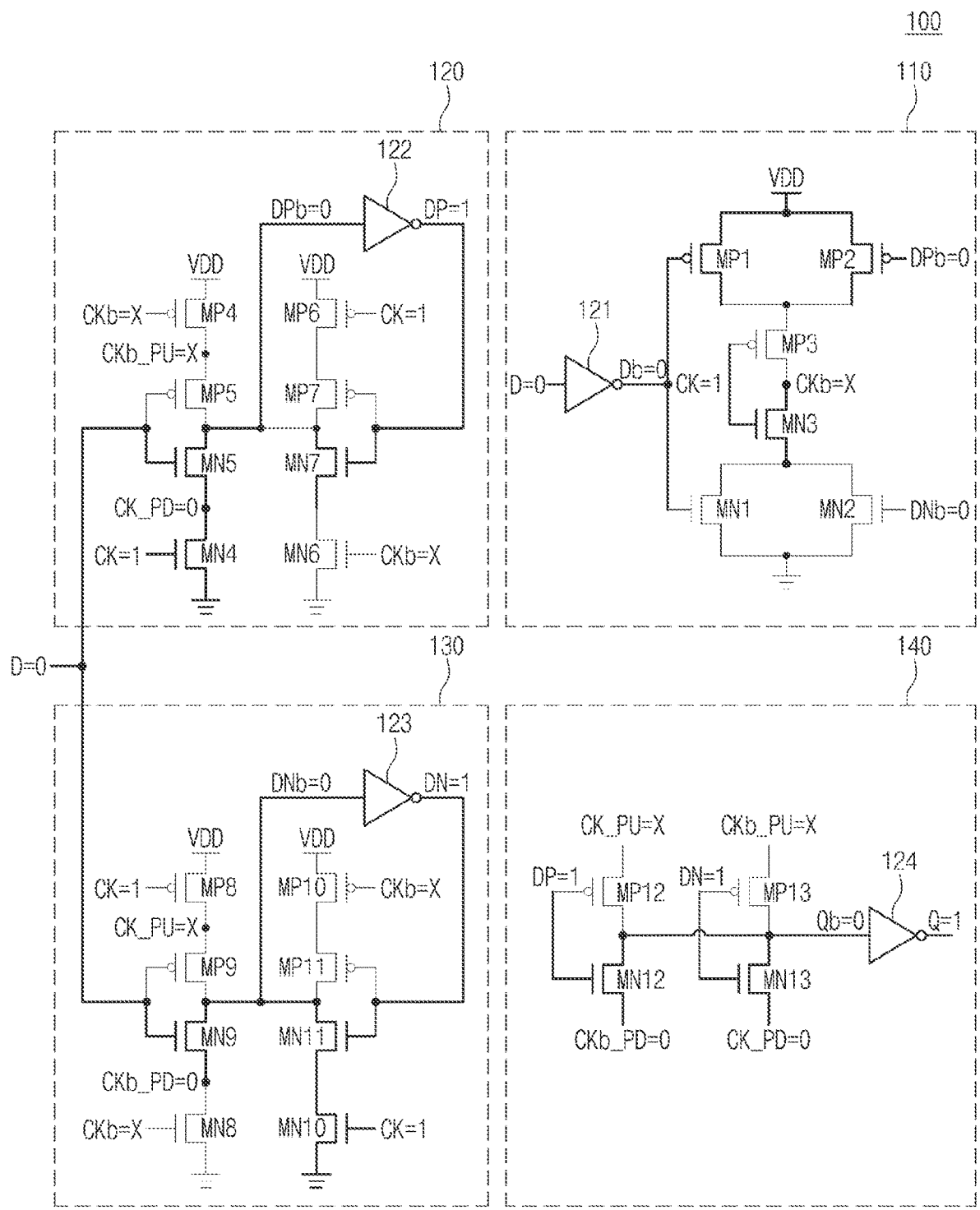
FIGS. 13 and 14 are circuit diagrams illustrating operation states of a flip-flop at a point in time t7 of FIG. 5.
Figure 14:
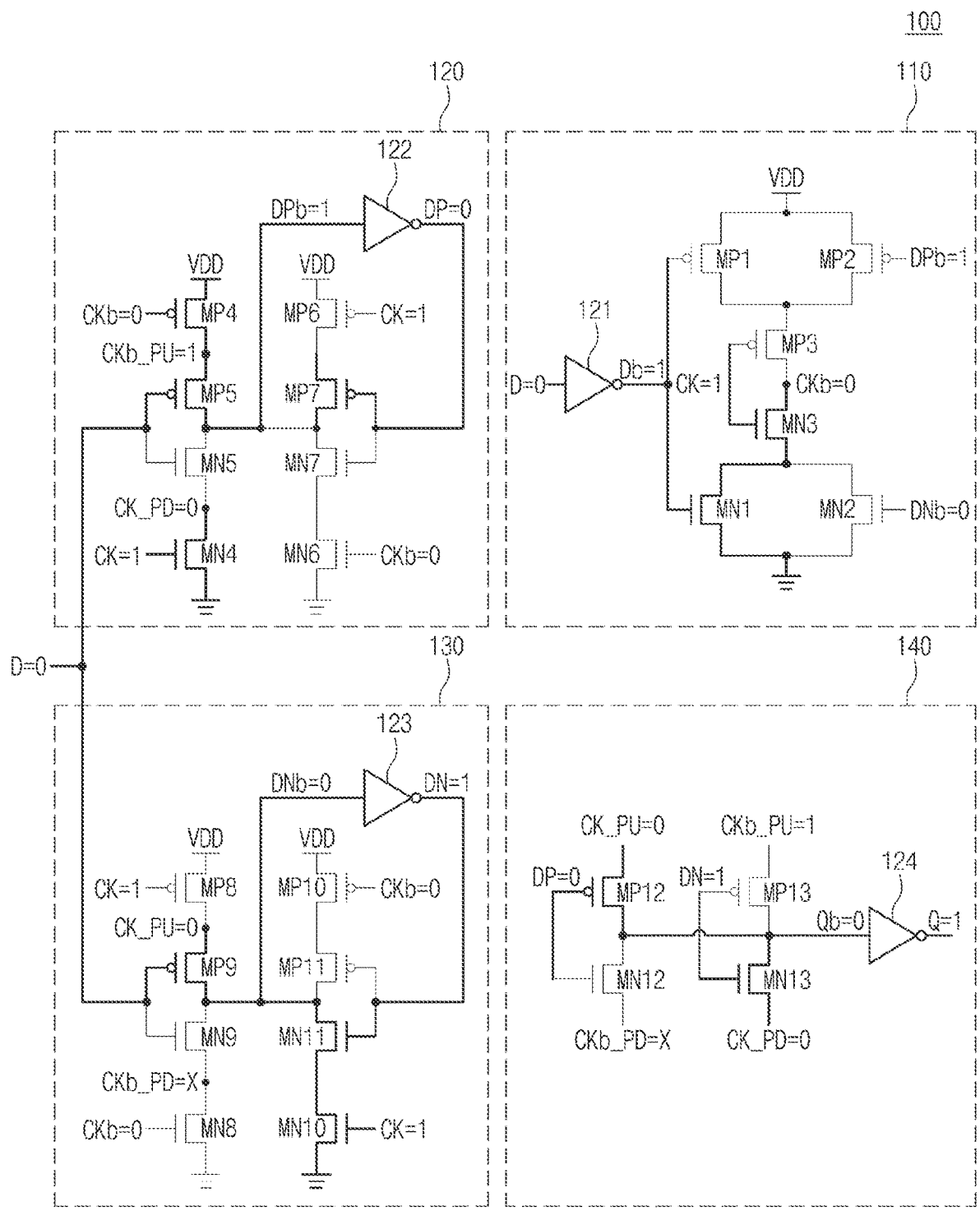

FIGS. 13 and 14 illustrate operation states of a flip-flop at a point in time t7 of FIG. 5.

An operation state of the flip-flop 100 at the point in time t7 will be described with reference to FIGS. 11, 13, and 14.

The point in time t7 indicates a point in time when the value of the input data bit "D" transitions from "1" to "0" while the clock signal CK maintains the value of "1". The flip-flop 100 may have state #13 of FIG. 11 immediately before the input data bit "D" changes from "1" to "0". The flip-flop 100 may have state #9 of FIG. 13 at the moment when the input data bit "D" changes from "1" to "0". The flip-flop 100 may have state #11 of FIG. 14 immediately after the input data bit "D" transition from "1" to "0".

First, the flip-flop 100 maintains state #13 of FIG. 11 immediately before the point in time t7 and then receives the input data bit "D", which may have a value of "0" at the point in time t7. Because the moment when the input data bit "D", which may have a value of "0" is received is illustrated in FIG. 13, FIG. 13 shows the flip-flop 100 where the previous state (e.g., state #13 of FIG. 11) is maintained except for the value of the input data bit "D".

Afterwards, as illustrated in FIG. 14, in the case of the input logic circuit 110, because the value of the inverted input data bit Db is "1", the first PMOS transistor MP1 is turned off, and the first NMOS transistor MN1 is turned on. Because the value of the clock signal CK is "1", the third PMOS transistor MP3 is turned off, and the third NMOS transistor MN3 is turned on. Accordingly, the clock bar signal CKb, which may have a value of "0" may be output from the node between the third PMOS transistor MP3 and the third NMOS transistor MN3.

In the case of the first latch 120, the fourth PMOS transistor MP4 is turned on by the clock bar signal CKb, which may have a value of "0", and the fifth PMOS transistor MP5 is also turned on by the input data bit "D", which may have a value of "0". Accordingly, the clock bar pull-up signal CKb_PU whose is "1" corresponding to the power supply voltage VDD may be output from the node between the fourth PMOS transistor MP4 and the fifth PMOS transistor MP5. The signal DPb of the input terminal of the second inverter 122 is maintained at "1" by the power supply voltage VDD; in this case, the second inverter 122 inverts the signal DPb and outputs the signal DP, which may have a value of "0".

Accordingly, the signal DPb, which may have a value of "1" may be input to the second inverter 122, and the second inverter 122 may output the signal DP, which may have a value of "0". Because the seventh NMOS transistor MN7 is turned off by the signal DP and the sixth PMOS transistor MP6 is turned on by the clock bar signal CK, which may have a value of "1", the value of the input terminal of the second inverter 122 is maintained at "1".

In the case of the second latch 130, the eighth PMOS transistor MP8 may be turned off by the clock signal CK, which may have a value of "1", and the ninth PMOS transistor MP9 may be turned on in by the input data bit "D", which may have a value of "0". The third inverter 123 inverts the signal DNb being maintained in the previous state (e.g., state #9 of FIG. 13) and outputs the signal DN, which may have a value of "1"; in this case, the eleventh NMOS transistor MN11 is turned on. Also, the tenth NMOS transistor MN10 is turned on by the clock signal CK. Accordingly, the clock pull-up signal CK_PU, which may have a value of "0" may be output from the node between the eighth PMOS transistor MP8 and the ninth PMOS transistor MP9.

In the case of the output multiplexer 140, the twelfth PMOS transistor MP12 may be turned on in response to the signal DP; in this case, the twelfth PMOS transistor MP12 may receive the clock pull-up signal CK_PU and may output the signal Qb, which may have a value of "0". The thirteenth NMOS transistor MN13 may be turned on in response to the signal DN; in this case, the thirteenth NMOS transistor MN13 may receive the clock pull-down signal CK_PD and may output the signal Qb, which may have a value of "0". The fourth inverter 124 may invert the signal Qb and may output the output data bit "Q", which may have a value of "1".

Figure 15:
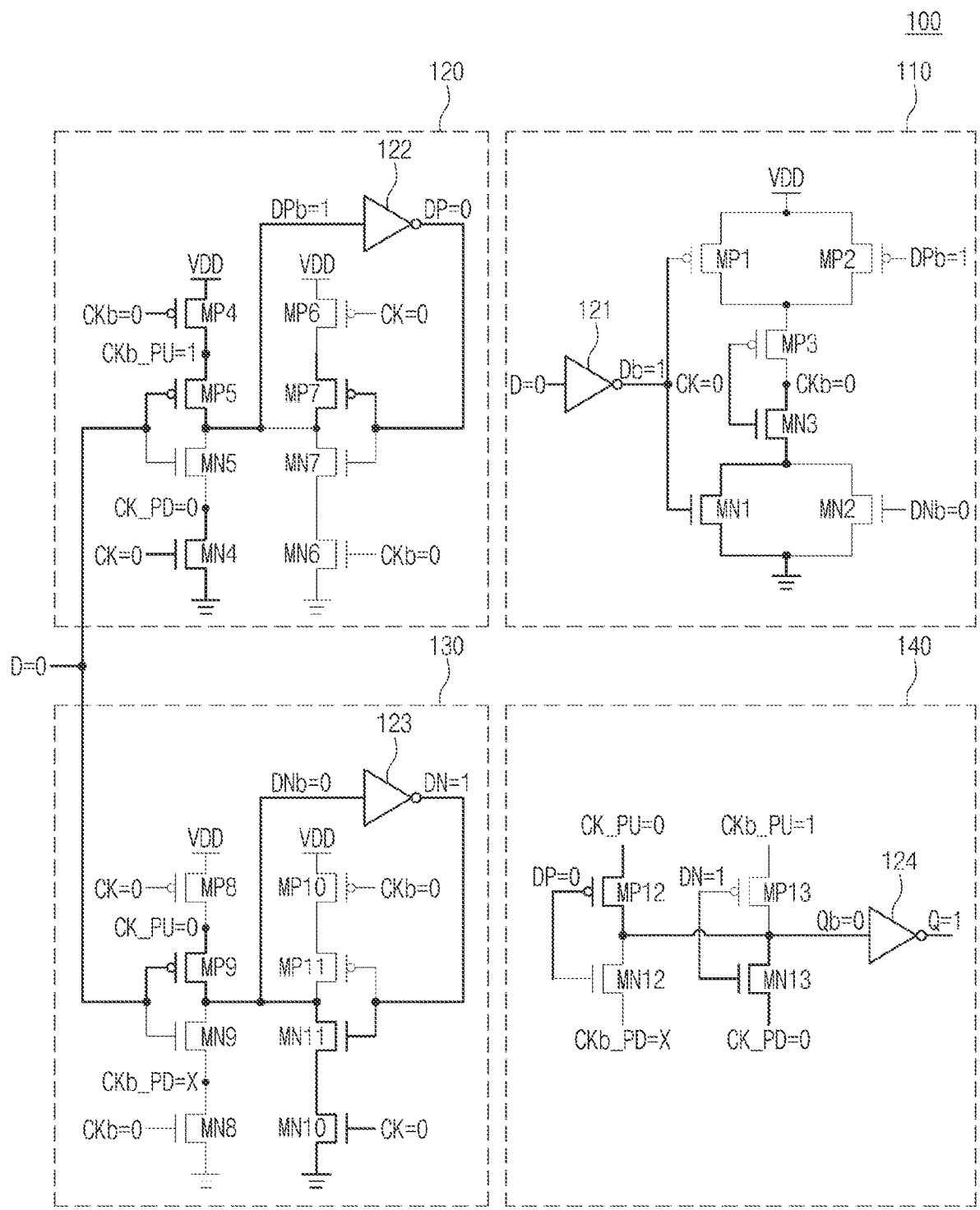
FIG. 15 is a circuit diagram illustrating an operation state of a flip-flop at a point in time t8 of FIG. 5.

FIG. 15 illustrates an operation state of a flip-flop at a point in time t8 of FIG. 5.

An operation state of the flip-flop 100 at the point in time t8 will be described with reference to FIGS. 6, 14, and 15.

The point in time t8 indicates a point in time when the value of the clock signal "CK" transitions from "1" to "0" in a state where the input data bit "D" maintains the value of "0". The flip-flop 100 may have state #11 of FIG. 14 immediately before the clock signal CK changes from "1" to "0". The flip-flop 100 may have state #3 of FIG. 15 at the moment when the clock signal CK changes from "1" to "0". The flip-flop 100 may have state #4 of FIG. 6 immediately after the clock signal CK transitions from "1" to "0".

Referring to FIG. 15, the flip-flop 100 may receive the clock signal CK of "0" in a state where the values illustrated in FIG. 14 are maintained. Afterwards, referring to FIG. 6, values of internal signals of the flip-flop 100 may substantially correspond to those of FIG. 6 by the clock signal CK, which may have a value of "0". Thus, additional description may be omitted to avoid redundancy. However, as illustrated in FIG. 15, because the clock bar signal CKb is set to the floating state, the value of the clock bar signal CKb, which corresponds to "X", may substantially correspond to the value of the previous state (e.g., state #3 of FIG. 15), such as "0". That is, the value of the clock bar signal CKb is uniformly maintained even in the period where the value of the input data bit "D" is uniformly maintained at "0".

Figure 16:
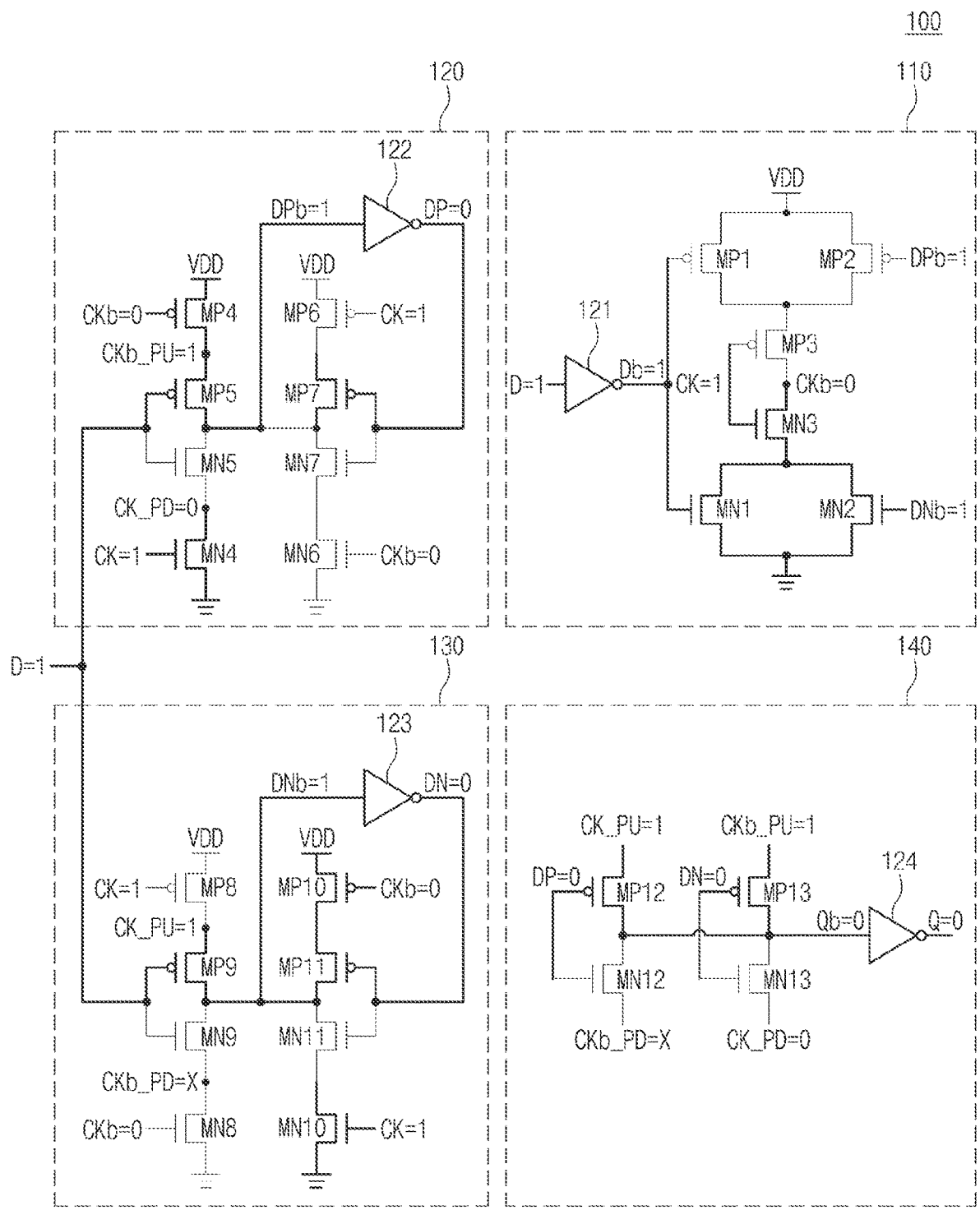
FIGS. 16 and 17 are circuit diagrams illustrating operation states of a flip-flop at a point in time t9 of FIG. 5.
Figure 17:
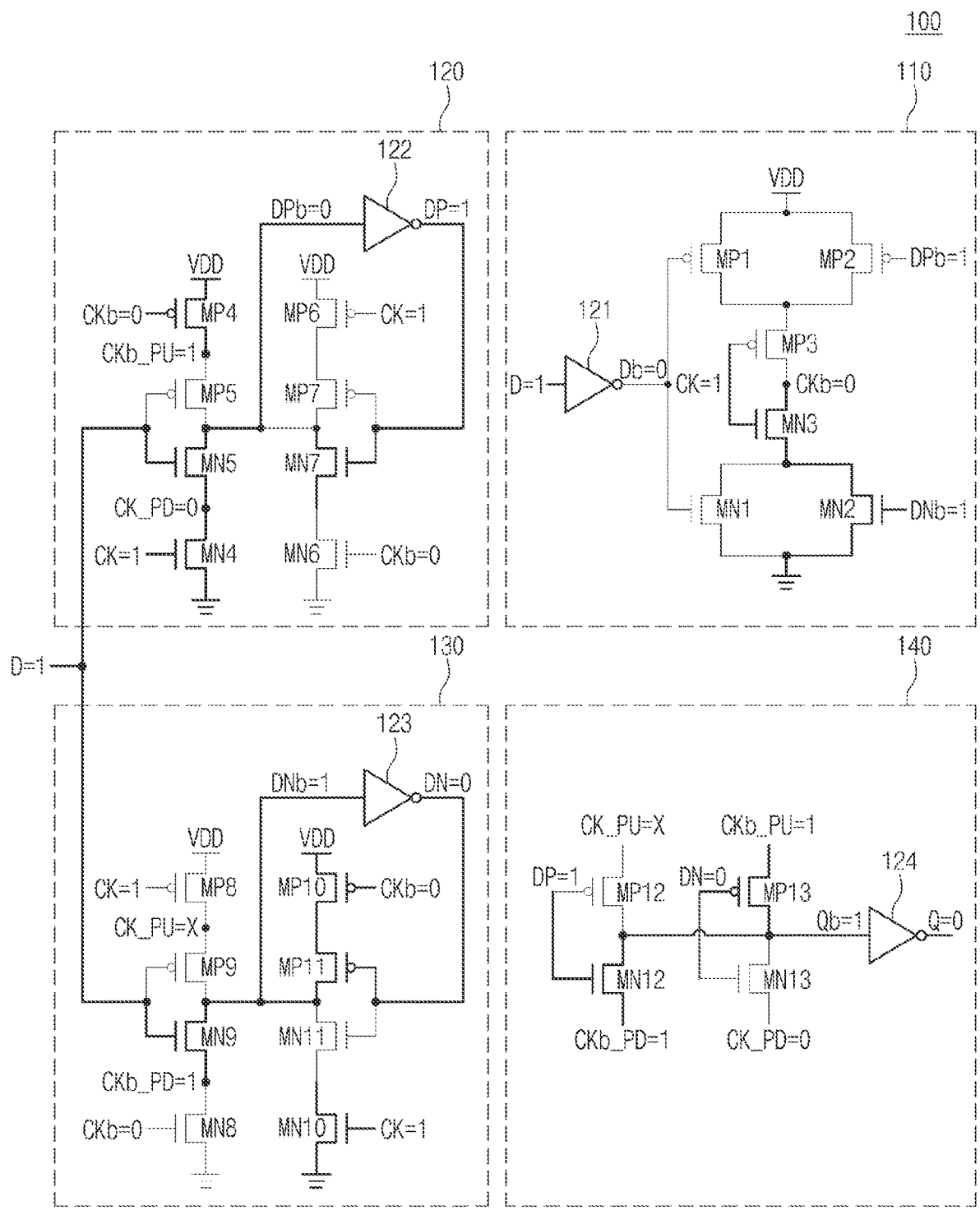

FIGS. 16 and 17 illustrate operation states of a flip-flop at a point in time t9 of FIG. 5.

An operation state of the flip-flop 100 at the point in time t9 may be described with reference to FIGS. 7, 16, and 17.

The point in time t9 indicates a point in time when the value of the input data bit "D" transitions from "0" to "1" while the clock signal CK maintains the value of "1". The flip-flop 100 may have state #12 of FIG. 7 immediately before the input data bit "D" changes from "0" to "1". The flip-flop 100 may have state #16 of FIG. 16 at the moment when the input data bit "D" changes from "0" to "1". The flip-flop 100 may have state #14 of FIG. 17 immediately after the input data bit "D" transition from "0" to "1".

First, the flip-flop 100 maintains state #12 of FIG. 7 immediately before the point in time t9 and then receives the input data bit "D", which may have a value of "1" at the point in time t9. Because the moment when the input data bit "D", which may have a value of "1" is received is illustrated in FIG. 16, FIG. 16 shows the flip-flop 100 where the previous state (e.g., state #13 of FIG. 7) is maintained except for the value of the input data bit "D".

Afterwards, referring to FIG. 17, as the input logic circuit 110 operates based on the input signal DNb of the third inverter 123 and the clock signal CK, which may have a value of "1", the clock bar signal CKb, which may have a value of "0" is output from the node between the third PMOS transistor MP3 and the third NMOS transistor MN3. The clock bar pull-up signal CKb_PU, which may have a value of "1" may be output from the node between the fourth PMOS transistor MP4 and the fifth PMOS transistor MP5. As the eighth PMOS transistor MP8 and the ninth PMOS transistor MP9 are turned off, the node between the eighth PMOS transistor MP8 and the ninth PMOS transistor MP9 may be set to the floating state, and thus, the clock pull-up signal CK_PU, which may have a value of "X" may be output from the node. In this case, the clock pull-up signal CK_PU may have substantially the same value (e.g., "1") as the clock pull-up signal CK_PU in the previous state (e.g., state #16 of FIG. 16). The output multiplexer 140 may invert the signal Qb and may output the output data bit "Q", which may have a value of "0".

Figure 18:
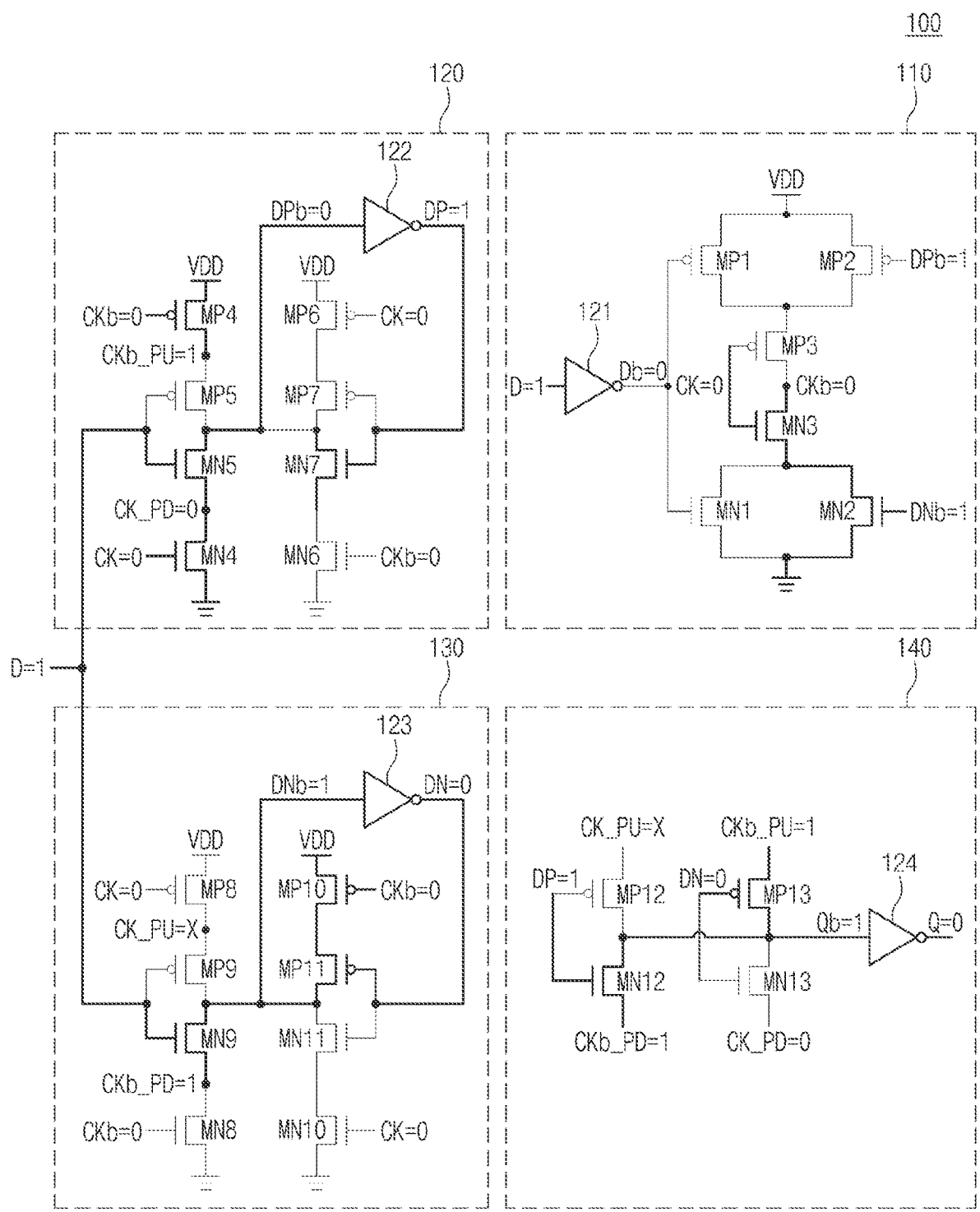
FIG. 18 is a circuit diagram illustrating an operation state of a flip-flop at a point in time t10 of FIG. 5.

FIG. 18 illustrates an operation state of a flip-flop at a point in time t10 of FIG. 5.

An operation state of the flip-flop 100 at the point in time t10 may be described with reference to FIGS. 12, 17, and 18.

The point in time t10 indicates a point in time when the value of the clock signal "CK" transitions from "0" to "1" in a state where the input data bit "D" maintains the value of "1". The flip-flop 100 may have state #14 of FIG. 17 immediately before the clock signal CK changes from "0" to "1". The flip-flop 100 may have state #6 of FIG. 18 at the moment when the clock signal CK changes from "0" to "1". The flip-flop 100 may have state #5 of FIG. 12 immediately after the clock signal CK transitions from "0" to "1".

The operation of the flip-flop 100 corresponding to state #14 is described above, and thus, additional description may be omitted to avoid redundancy. Because the moment when the clock signal CK, which may have a value of "1" is received is illustrated in FIG. 18, FIG. 18 shows the flip-flop 100 where the previous state (e.g., state #14 of FIG. 17) is maintained except for the value of the clock signal CK. The operation of the flip-flop 100 corresponding to state #5 after the clock signal CK, which may have a value of "1" is received is described above, and thus, additional description may be omitted to avoid redundancy.

Figure 19:
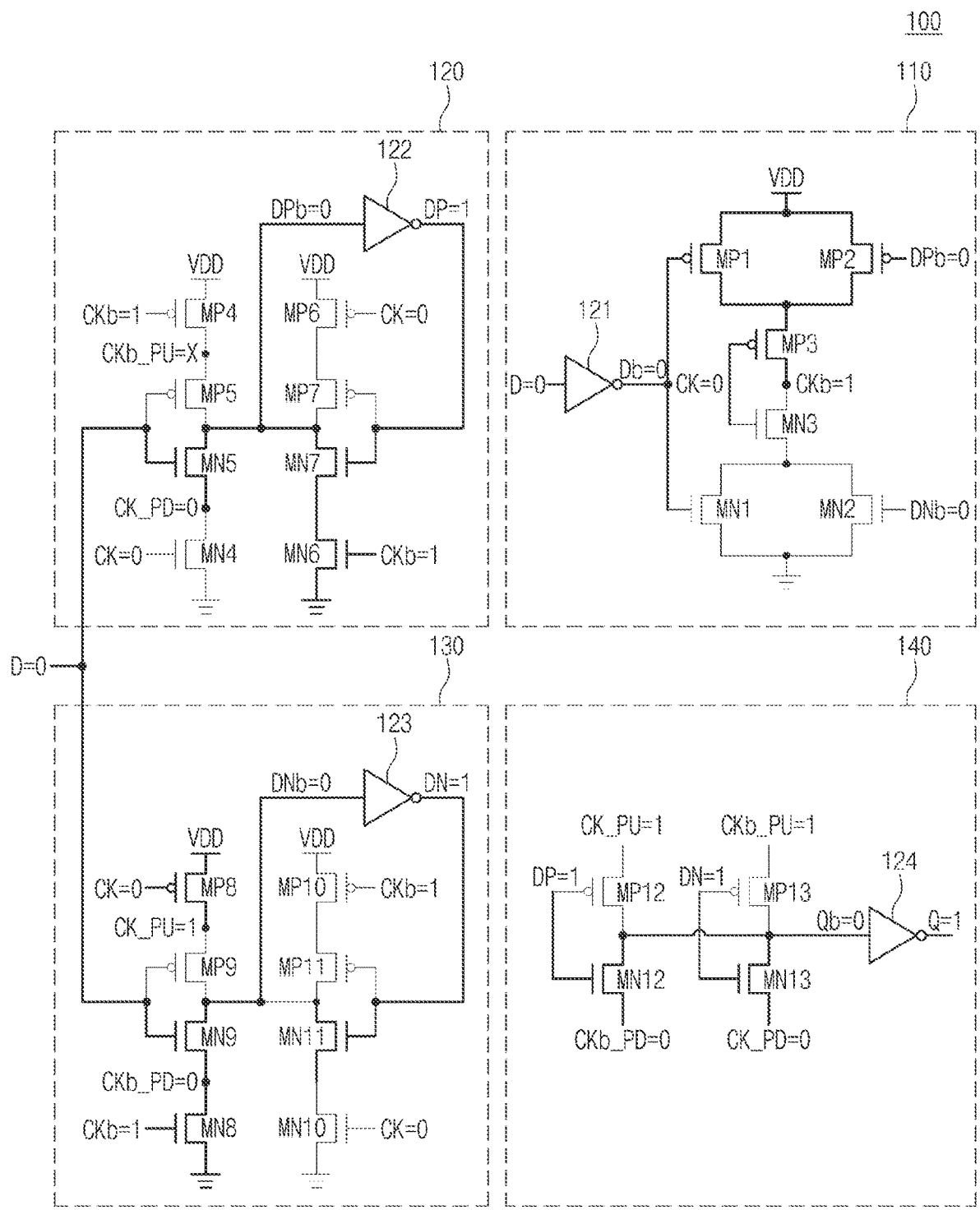
FIGS. 19 and 20 are circuit diagrams illustrating operation states of a flip-flop at a point in time t11 of FIG. 5.
Figure 20:
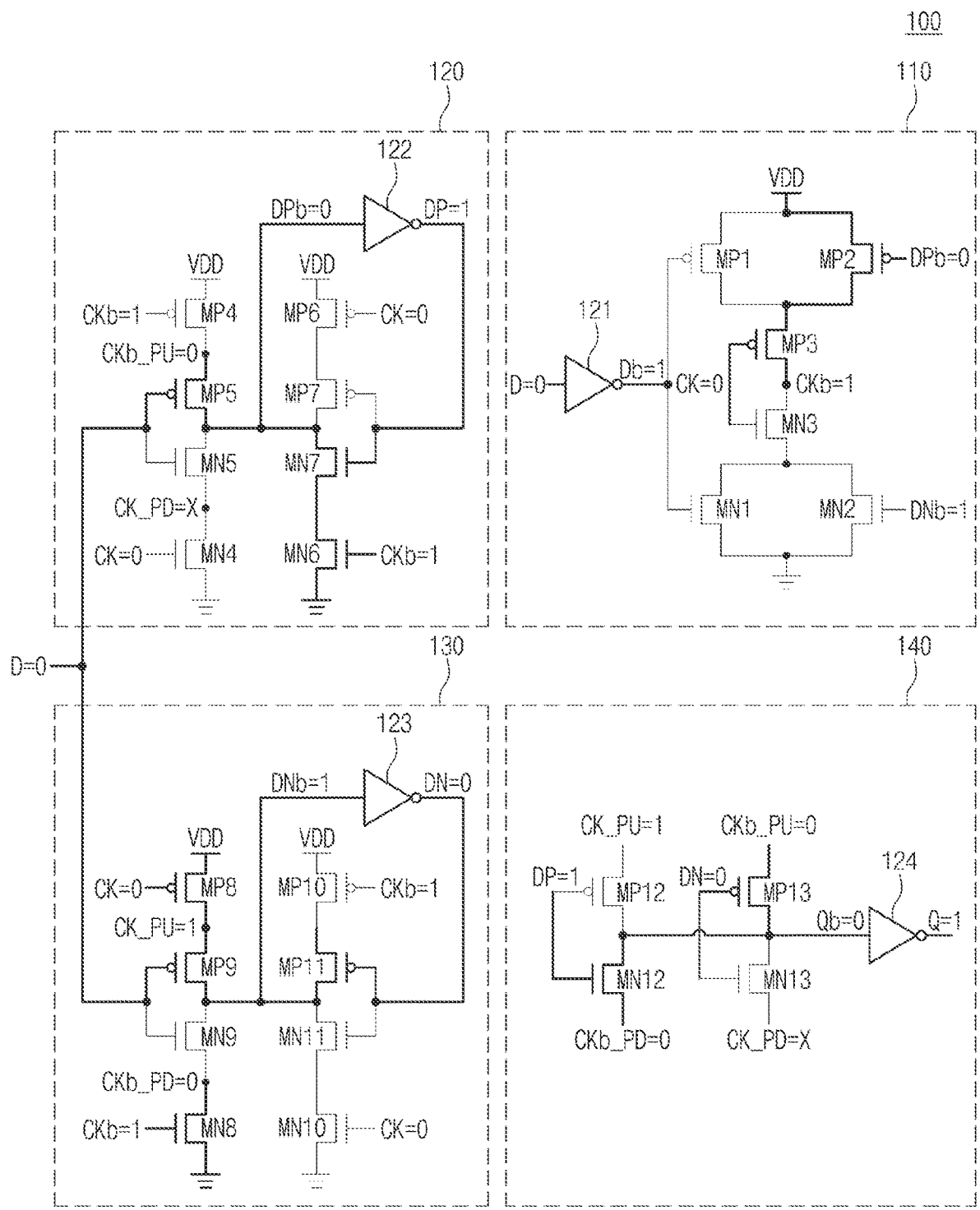

FIGS. 19 and 20 illustrate operation states of a flip-flop at a point in time t11 of FIG. 5.

An operation state of the flip-flop 100 at the point in time t11 may be described with reference to FIGS. 12, 19, and 20.

The point in time t11 indicates a point in time when the value of the input data bit "D" transitions from "1" to "0" while the clock signal CK maintains the value of "0". The flip-flop 100 may have state #5 of FIG. 12 immediately before the input data bit "D" changes from "1" to "0". The flip-flop 100 may have state #1 of FIG. 19 at the moment when the input data bit "D" changes from "1" to "0". The flip-flop 100 may have state #2 of FIG. 20 immediately after the input data bit "D" transition from "1" to First, the flip-flop 100 maintains state #5 of FIG. 12 immediately before the point in time t11 and then receives the input data bit "D", which may have a value of "0" at the point in time t11. Because the moment when the input data bit "D", which may have a value of "1" is received is illustrated in FIG. 19, FIG. 19 shows the flip-flop 100 where the previous state (e.g., state #5 of FIG. 12) is maintained except for the value of the input data bit "D".

Afterwards, referring to FIG. 20, as the input logic circuit 110 operates based on the input signal DPb of the second inverter 122 and the clock signal CK, which may have a value of "0", the clock bar signal CKb, which may have a value of "1" is output from the node between the third PMOS transistor MP3 and the third NMOS transistor MN3.

The clock bar pull-up signal CKb_PU, which may have a value of "0" may be output from the node between the fourth PMOS transistor MP4 and the fifth PMOS transistor MP5. As the fourth NMOS transistor MN4 and the fifth NMOS transistor MN5 are turned off, the node between the fourth NMOS transistor MN4 and the fifth NMOS transistor MN5 may be set to the floating state, and thus, the clock bar pull-down signal CKb_PD, which may have a value of "X" may be output from the node.

As the eighth PMOS transistor MP8 and the ninth PMOS transistor MP9 are turned on, the clock pull-up signal CK_PU, which may have a value of "1" may be output from the node between the eighth PMOS transistor MP8 and the ninth PMOS transistor MP9. As the eighth NMOS transistor MN8 is turned on, the clock bar pull-down signal CKb_PD, which may have a value of "0" may be output from the node between the eighth NMOS transistor MN8 and the ninth NMOS transistor MN9.

As such, the output multiplexer 140 may invert the signal Qb output from the twelfth NMOS transistor MN12 and the thirteenth PMOS transistor MP13 and may output the output data bit "Q", which may have a value of "0".

Figure 21:
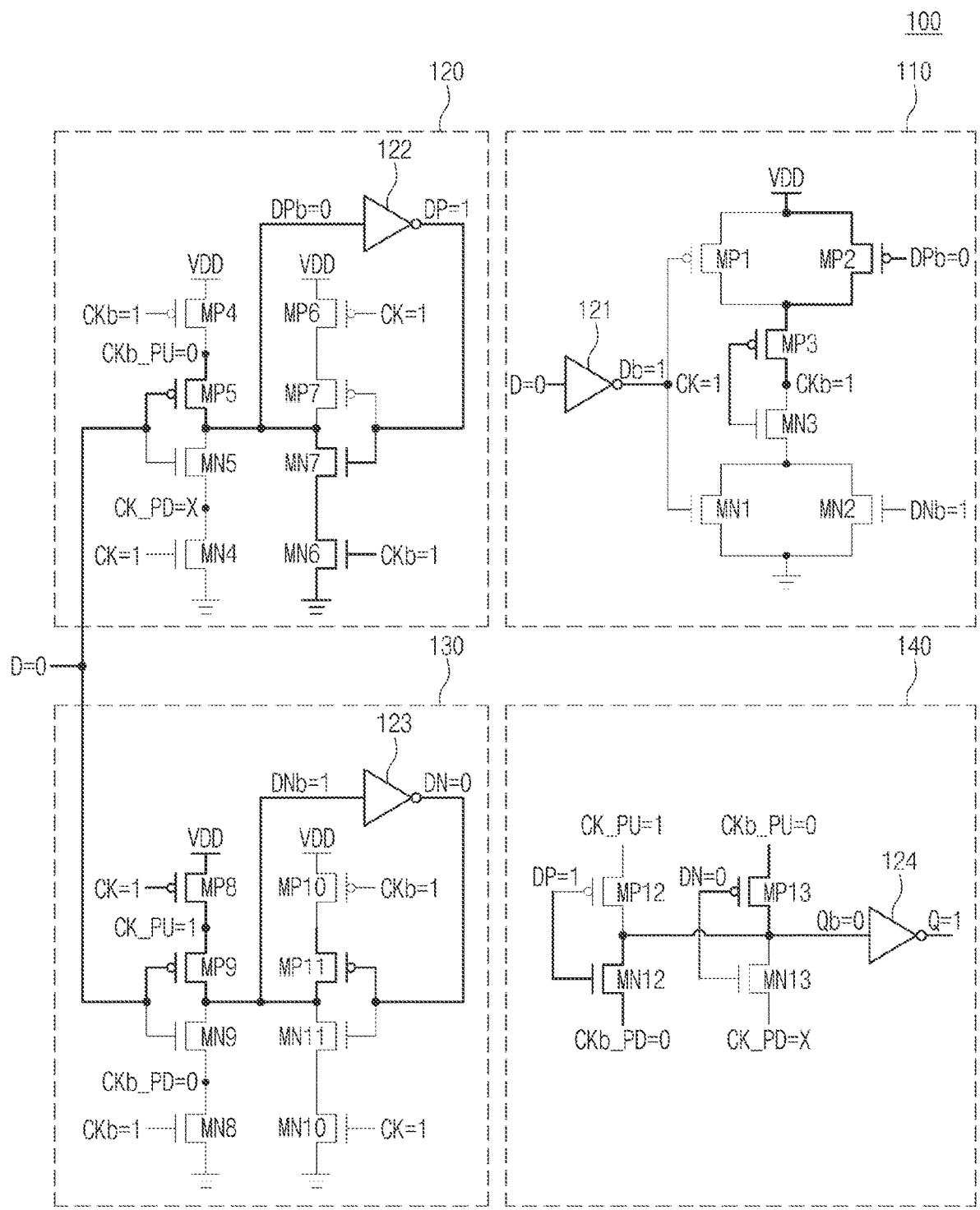
FIG. 21 is a circuit diagram illustrating an operation state of a flip-flop at a point in time t12 of FIG. 5.

FIG. 21 illustrates an operation state of a flip-flop at a point in time t12 of FIG. 5.

An operation state of the flip-flop 100 at the point in time t12 may be described with reference to FIGS. 7, 20, and 21.

The point in time t12 indicates a point in time when the value of the clock signal "CK" transitions from "0" to "1" in a state where the input data bit "D" maintains the value of "0". The flip-flop 100 may have state #2 of FIG. 20 immediately before the clock signal CK changes from "0" to "1". The flip-flop 100 may have state #10 of FIG. 21 at the moment when the clock signal CK changes from "0" to "1". The flip-flop 100 may have state #12 of FIG. 7 immediately after the clock signal CK transitions from "0" to "1".

First, the flip-flop 100 maintains state #2 of FIG. 20 immediately before the point in time t12 and then receives the clock signal CK, which may have a value of "1" at the point in time t12. Because the moment when the clock signal CK, which may have a value of "1" is received is illustrated in FIG. 21, FIG. 21 shows the flip-flop 100 where the previous state (e.g., state #2 of FIG. 20) is maintained except for the value of the clock signal CK. The operation of the flip-flop 100 corresponding to state #12 after the clock signal CK, which may have a value of "1" is received is described with reference to FIG. 7, and thus, additional description be omitted to avoid redundancy.

Figure 22:
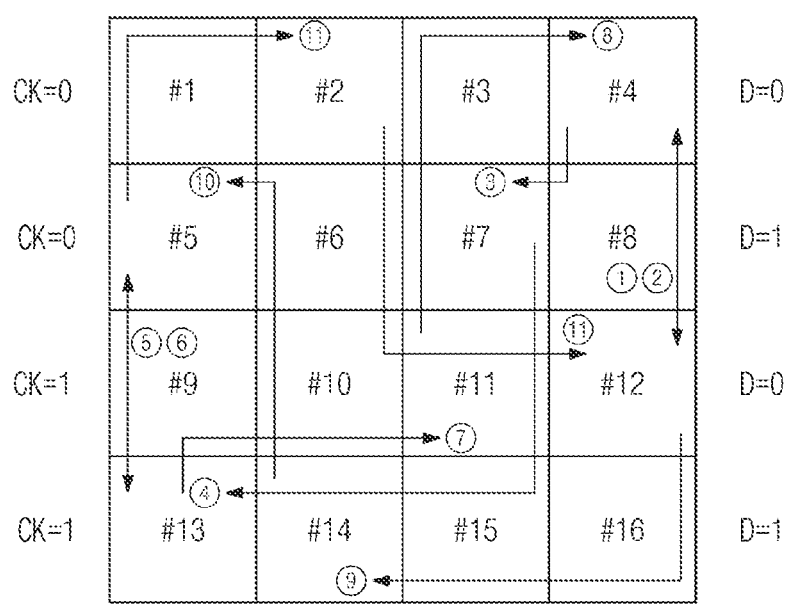
FIG. 22 is a state transition diagram illustrating how a flip-flop of the present disclosure transitions between 16 states.

FIG. 22 illustrates how the flip-flop 100 of the present disclosure transitions between 16 states.

Referring to FIG. 22, a number in a round circle indicates a time point number in the waveform of FIG. 5, and a number with an attached "#" prefix indicates a state number.

At point in time t1, the flip-flop 100 may change from state #4 to state #12. At point in time t2, the flip-flop 100 may change from state #12 to state #4. At point in time t3, the flip-flop 100 may change from state #4 to state #7 through state #8. At point in time t4, the flip-flop 100 may change from state #7 to state #13 through state #15. At point in time t5, the flip-flop 100 may change from state #13 to state #5. At point in time t6, the flip-flop 100 may change from state #5 to state #13. At point in time t7, the flip-flop 100 may change from state #13 to state #11 through state #9. At point in time t8, the flip-flop 100 may change from state #11 to state #4 through state #3. At point in time t9, the flip-flop 100 may change from state #12 to state #14 through state #16. At point in time t10, the flip-flop 100 may change from state #14 to state #5 through state #6. At point in time t11, the flip-flop 100 may change from state #5 to state #2 through state #1. At point in time t12, the flip-flop 100 may change from state #2 to state #12 through state #10.

Figure 23:
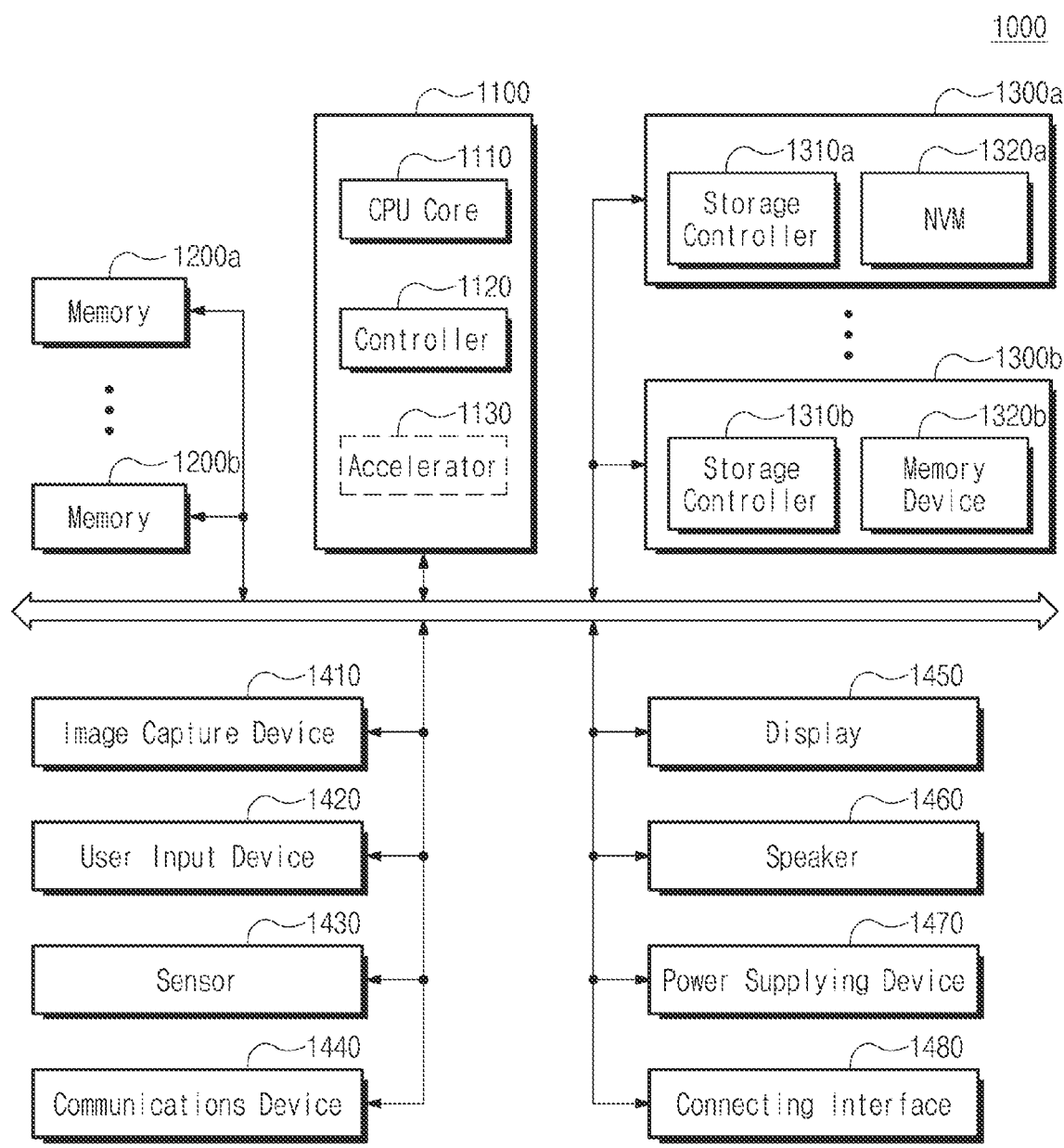
FIG. 23 is a block diagram illustrating a system to which a memory device including a flip-flop according to an embodiment of the present disclosure is applied.

FIG. 23 illustrates a system 1000 to which a storage device is applied, according to an embodiment.

Referring to FIG. 23, the system 1000 may include a main processor 1100, memories (e.g., 1200*a* and 1200*b*), and storage devices (e.g., 1300*a* and 1300*b*). In addition, the system 1000 may include at least one of an image capturing device 1410, a user input device 1420, a sensor 1430, a communication device 1440, a display 1450, a speaker 1460, a power supplying device 1470, and a connecting interface 1480. The system 1000 may include the flip-flop described with reference to FIGS. 2 to 22.

The main processor 1100 may control operations of the system 1000, such as operations of other components included in the system 1000. The main processor 1100 may be implemented as a general-purpose processor, a dedicated processor, or an application processor, without limitation thereto.

The main processor 1100 may include at least one CPU core 1110 and further include a controller 1120 configured to control the memories 1200*a* and 1200*b* and/or the storage devices 1300*a* and 1300*b*. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU); and may be implemented as a chip that is physically separate or separable from the other components of the main processor 1100, without limitation thereto.

The memories 1200*a* and 1200*b* may be used as main memory devices of the system 1000. Although each of the memories 1200*a* and 1200*b* may include a volatile memory, such as static random access memory (SRAM) and/or dynamic RAM (DRAM), each of the memories 1200*a* and 1200*b* may include non-volatile memory, such as a flash memory, phase-change RAM (PRAM) and/or resistive RAM (RRAM). The memories 1200*a* and 1200*b* may be implemented in the same package as the main processor 1100, without limitation thereto.

The storage devices 1300*a* and 1300*b* may serve as non-volatile storage devices configured to store data regardless of whether power is supplied thereto, and have larger storage capacity than the memories 1200*a* and 1200*b*. The storage devices 1300*a* and 1300*b* may respectively include storage controllers (STRG CTRL) 1310*a* and 1310*b* and Non-Volatile Memory (NVM) arrays 1320*a* and 1320*b* configured to store data via the control of the storage controllers 1310*a* and 1310*b*. Although the NVMs 1320*a* and 1320*b* may include flash memories having a twodimensional (2D) structure or a three-dimensional (3D) V-NAND structure, the NVMs 1320a and 1320b may include other types of NVMs, such as but not limited to PRAM and/or RRAM.

The storage devices 1300a and 1300b may be physically separated from the main processor 1100 and included in the system 1000, or implemented in the same package as the main processor 1100, without limitation thereto. In addition, the storage devices 1300a and 1300b may have types of solid-state devices (SSDs) or memory cards and be removably combined with other components of the system 100 through an interface, such as the connecting interface 1480 that may be described below in greater detail. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images and/or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone. Moreover, the user input device 1420 may include virtual reality (VR) inputs.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor, without limitation thereto.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000. A tactile, braille and/or neural interface may similarly be provided as an output device.

The power supplying device 1470 may appropriately convert power supplied from a battery embedded in the system 1000 and/or an external power source, and supply the converted power to each of components of the system 1000. The power supplying device 1470 may receive feedback from the system 1000, without limitation thereto.

The connecting interface 1480 may provide connection between the system 1000 and an external device, such as one which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and/or a compact flash (CF) card interface, without limitation thereto.

According to embodiments of the present disclosure, a redundant transition of a clock bar signal, which is based on a clock signal, may be prevented in a period where a value of an output data bit of a flip-flop does not change. Accordingly, power consumption due to the redundant transition of the clock bar signal may be optimized or decrease.

While the present disclosure has been described with reference to embodiments thereof, it will be apparent to those of ordinary skill in the pertinent art that various changes and modifications may be made thereto without departing from the spirit and scope of the present disclosure as set forth in the following claims.

What is claimed is:

1. A flip-flop comprising:
an input logic circuit including a first inverter having a first input connected to a data bit and a first output, and a first clocked complementary metal-oxide semiconductor (C2MOS) circuit having a second input connected to the first output, a third input connected to a clock signal, and a clock bar signal output;
a first latch including a second C2MOS circuit having a data bit input connected to the data bit input of the input logic circuit, the clock signal, and the clock bar signal, a third C2MOS circuit, and a second inverter including an input terminal connected with an output terminal of the second C2MOS circuit and an output terminal of the third C2MOS circuit and an output terminal connected with an input terminal of the third C2MOS circuit;
a second latch including a fourth C2MOS circuit receiving the input data bit, the clock signal, and the clock bar signal, a fifth C2MOS circuit, and a third inverter including an input terminal connected with an output terminal of the fourth C2MOS circuit and an output terminal of the fifth C2MOS circuit and an output terminal connected with an input terminal of the fifth C2MOS circuit; and
an output multiplexer configured to output an output data bit by inverting a signal which is based on at least one of an output signal of a node between positive-channel metal-oxide semiconductor (PMOS) transistors of the second C2MOS circuit, an output signal of a node between negative-channel metal-oxide semiconductor (NMOS) transistors of the second C2MOS circuit, an output signal of a node between PMOS transistors of the fourth C2MOS circuit, and an output signal of a node between NMOS transistors of the fourth C2MOS circuit.

2. The flip-flop of claim 1,
wherein the first C2MOS circuit of the input logic circuit includes a first PMOS transistor, a second PMOS transistor, a third PMOS transistor, a first NMOS transistor, a second NMOS transistor, and a third NMOS transistor,
wherein the first PMOS transistor, the third PMOS transistor, the third NMOS transistor, and the first NMOS transistor are connected in series between a node provided with a power supply voltage and a node provided with a ground voltage, wherein the second PMOS transistor is connected in parallel with the first PMOS transistor,
wherein the second NMOS transistor is connected in parallel with the first NMOS transistor,
wherein a gate electrode of the first PMOS transistor and a gate electrode of the first NMOS transistor are connected with an output terminal of the first inverter,
wherein a gate electrode of the second PMOS transistor is connected with the input terminal of the second inverter, and wherein a gate electrode of the second NMOS transistor is connected with the input terminal of the third inverter.

3. The flip-flop of claim 2,
wherein the second C2MOS circuit includes a fourth PMOS transistor, a fifth PMOS transistor, a fifth NMOS transistor, and a fourth NMOS transistor connected in series between the node provided with the power supply voltage and the node provided with the ground voltage,
wherein the third C2MOS circuit includes a sixth PMOS transistor, a seventh PMOS transistor, a seventh NMOS transistor, and a sixth NMOS transistor connected in series between the node provided with the power supply voltage and the node provided with the ground voltage, and
wherein a node between the fifth PMOS transistor and the fifth NMOS transistor and a node between the seventh PMOS transistor and the seventh NMOS transistor are connected with the input terminal of the second inverter.

4. The flip-flop of claim 3,
wherein a gate electrode of the fourth PMOS transistor receives the clock bar signal output from a node between the third PMOS transistor and the third NMOS transistor,
wherein a gate electrode of the fifth PMOS transistor and a gate electrode of the fifth NMOS transistor receive the input data bit,
wherein a gate electrode of the fourth NMOS transistor receives the clock signal,
wherein a gate electrode of the sixth PMOS transistor receives the clock signal,
wherein a gate electrode of the seventh PMOS transistor and a gate electrode of the seventh NMOS transistor are connected with the output terminal of the second inverter, and
wherein a gate electrode of the sixth NMOS transistor receives the clock bar signal.

5. The flip-flop of claim 3,
wherein the fourth C2MOS circuit includes an eighth PMOS transistor, a ninth PMOS transistor, a ninth NMOS transistor, and an eighth NMOS transistor connected in series between the node provided with the power supply voltage and the node provided with the ground voltage,
wherein the fifth C2MOS circuit includes a tenth PMOS transistor, an eleventh PMOS transistor, an eleventh NMOS transistor, and a tenth NMOS transistor connected in series between the node provided with the power supply voltage and the node provided with the ground voltage, and
wherein a node between the ninth PMOS transistor and the ninth NMOS transistor and a node between the eleventh PMOS transistor and the eleventh NMOS transistor are connected with the input terminal of the third inverter.

6. The flip-flop of claim 5,
wherein a gate electrode of the eighth PMOS transistor receives the clock signal,
wherein a gate electrode of the ninth PMOS transistor and a gate electrode of the ninth NMOS transistor receive the input data bit,
wherein a gate electrode of the eighth NMOS transistor receives the clock bar signal,
wherein a gate electrode of the tenth PMOS transistor receives the clock bar signal, wherein a gate electrode of the eleventh PMOS transistor and a gate electrode of the eleventh NMOS transistor are connected with the output terminal of the third inverter, and
wherein a gate electrode of the tenth NMOS transistor receives the clock signal.

7. The flip-flop of claim 5, wherein the output multiplexer includes:
a thirteenth PMOS transistor and a thirteenth NMOS transistor connected in series between a first node between the fourth PMOS transistor and the fifth PMOS transistor and a second node between the fifth NMOS transistor and the fourth NMOS transistor; and
a twelfth PMOS transistor and a twelfth NMOS transistor connected in series between a third node between the eighth PMOS transistor and the ninth PMOS transistor and a fourth node between the ninth NMOS transistor and the eighth NMOS transistor,
wherein a node between the twelfth PMOS transistor and the twelfth NMOS transistor and a node between the thirteenth PMOS transistor and the thirteenth NMOS transistor are connected with an input terminal of a fourth inverter.

8. The flip-flop of claim 7,
wherein a gate electrode of the twelfth PMOS transistor and a gate electrode of the twelfth NMOS transistor are connected with the output terminal of the second inverter, and
wherein a gate electrode of the thirteenth PMOS transistor and a gate electrode of the thirteenth NMOS transistor are connected with the output terminal of the third inverter.

9. A flip-flop configured to output an output data bit based on a clock signal and an input data bit, comprising:
an input logic circuit configured to output a clock bar signal whose value does not change in a period where the output data bit has a uniform value, based on the input data bit and the clock signal;
a first latch configured to latch the input data bit in response to the clock signal having a first value;
a second latch configured to latch the input data bit in response to the clock signal having a second value; and
an output multiplexer configured to output the output data bit based on data latched by the first latch and data latched by the second latch.

10. The flip-flop of claim 9, wherein the input logic circuit includes:
a first inverter configured to invert the input data bit;
a first positive-channel metal-oxide semiconductor (PMOS) transistor, a third PMOS transistor, a third negative-channel metal-oxide semiconductor (NMOS) transistor, and a first NMOS transistor connected in series between a node provided with a power supply voltage and a node provided with a ground voltage;
a second PMOS transistor connected in parallel with the first PMOS transistor; and
a second NMOS transistor connected in parallel with the first NMOS transistor,
wherein a gate electrode of the first PMOS transistor and a gate electrode of the first NMOS transistor are connected with an output terminal of the first inverter,
wherein a gate electrode of the second PMOS transistor is connected with an input terminal of a second inverter, and
wherein a gate electrode of the second NMOS transistor is connected with an input terminal of a third inverter.

11. The flip-flop of claim 10, wherein the first latch includes:
   a fourth PMOS transistor, a fifth PMOS transistor, a fifth NMOS transistor, and a fourth NMOS transistor connected in series between the node provided with the power supply voltage and the node provided with the ground voltage;
   a sixth PMOS transistor, a seventh PMOS transistor, a seventh NMOS transistor, and a sixth NMOS transistor connected in series between the node provided with the power supply voltage and the node provided with the ground voltage; and
   the second inverter including the input terminal connected with a node between the fifth PMOS transistor and the fifth NMOS transistor and a node between the seventh PMOS transistor and the seventh NMOS transistor, and an output terminal connected with a gate electrode of the seventh PMOS transistor and a gate electrode of the seventh NMOS transistor.

12. The flip-flop of claim 10,
   wherein a gate electrode of the fourth PMOS transistor receives the clock bar signal output from a node between the third PMOS transistor and the third NMOS transistor,
   wherein a gate electrode of the fifth PMOS transistor and a gate electrode of the fifth NMOS transistor receive the input data bit,
   wherein a gate electrode of the fourth NMOS transistor receives the clock signal,
   wherein a gate electrode of the sixth PMOS transistor receives the clock signal,
   wherein a gate electrode of the seventh PMOS transistor and a gate electrode of the seventh NMOS transistor are connected with the output terminal of the second inverter, and
   wherein a gate electrode of the sixth NMOS transistor receives the clock bar signal.

13. The flip-flop of claim 11, wherein the second latch includes:
   an eighth PMOS transistor, a ninth PMOS transistor, a ninth NMOS transistor, and an eighth NMOS transistor connected in series between the node provided with the power supply voltage and the node provided with the ground voltage;
   a tenth PMOS transistor, an eleventh PMOS transistor, an eleventh NMOS transistor, and a tenth NMOS transistor connected in series between the node provided with the power supply voltage and the node provided with the ground voltage; and
   the third inverter including the input terminal connected with a node between the ninth PMOS transistor and the ninth NMOS transistor and a node between the eleventh PMOS transistor and the eleventh NMOS transistor, and an output terminal connected with a gate electrode of the eleventh PMOS transistor and a gate electrode of the eleventh NMOS transistor.

14. The flip-flop of claim 13,
   wherein a gate electrode of the eighth PMOS transistor receives the clock signal,
   wherein a gate electrode of the ninth PMOS transistor and a gate electrode of the ninth NMOS transistor receive the input data bit,
   wherein a gate electrode of the eighth NMOS transistor receives the clock bar signal,
   wherein a gate electrode of the tenth PMOS transistor receives the clock bar signal,
   wherein a gate electrode of the eleventh PMOS transistor and a gate electrode of the eleventh NMOS transistor are connected with the output terminal of the third inverter, and
   wherein a gate electrode of the tenth NMOS transistor receives the clock signal.

15. The flip-flop of claim 13, wherein the output multiplexer includes:
   a thirteenth PMOS transistor and a thirteenth NMOS transistor connected in series between a first node between the fourth PMOS transistor and the fifth PMOS transistor and a second node between the fifth NMOS transistor and the fourth NMOS transistor;
   a twelfth PMOS transistor and a twelfth NMOS transistor connected in series between a third node between the eighth PMOS transistor and the ninth PMOS transistor and a fourth node between the ninth NMOS transistor and the eighth NMOS transistor; and
   a fourth inverter including an input terminal connected with a node between the twelfth PMOS transistor and the twelfth NMOS transistor and a node between the thirteenth PMOS transistor and the thirteenth NMOS transistor, and an output terminal outputting the output data bit.

16. A flip-flop comprising:
   an input logic circuit including a first positive-channel metal-oxide semiconductor (PMOS) transistor, a third PMOS transistor, and a third negative-channel metal-oxide semiconductor (NMOS) transistor, and a first NMOS transistor connected in series between a node provided with a power supply voltage and a node provided with a ground voltage, a second PMOS transistor connected in parallel with the first PMOS transistor, a second NMOS transistor connected in parallel with the first NMOS transistor, and a first inverter including an output terminal connected with a gate electrode of the first PMOS transistor and a gate electrode of the first NMOS transistor;
   a first latch including a fourth PMOS transistor, a fifth PMOS transistor, a fifth NMOS transistor, and a fourth NMOS transistor connected in series between the node provided with the power supply voltage and the node provided with the ground voltage, a sixth PMOS transistor, a seventh PMOS transistor, a seventh NMOS transistor, and a sixth NMOS transistor connected in series between the node provided with the power supply voltage and the node provided with the ground voltage, and a second inverter including an input terminal connected with a node between the fifth PMOS transistor and the fifth NMOS transistor and a node between the seventh PMOS transistor and the seventh NMOS transistor and an output terminal connected with a gate electrode of the seventh PMOS transistor and a gate electrode of the seventh NMOS transistor;
   a second latch including an eighth PMOS transistor, a ninth PMOS transistor, a ninth NMOS transistor, and an eighth NMOS transistor connected in series between the node provided with the power supply voltage and the node provided with the ground voltage, a tenth PMOS transistor, an eleventh PMOS transistor, an eleventh NMOS transistor, and a tenth NMOS transistor connected in series between the node provided with the power supply voltage and the node provided with the ground voltage, and a third inverter including an input terminal connected with a node between the ninth PMOS transistor and the ninth NMOS transistor and a node between the eleventh PMOS transistor and the eleventh NMOS transistor and an output terminal connected with a gate electrode of the eleventh PMOS transistor and a gate electrode of the eleventh NMOS transistor; and an output multiplexer including a thirteenth PMOS transistor and a thirteenth NMOS transistor connected in series between a first node between the fourth PMOS transistor and the fifth PMOS transistor and a second node between the fifth NMOS transistor and the fourth NMOS transistor, a twelfth PMOS transistor and a twelfth NMOS transistor connected in series between a third node between the eighth PMOS transistor and the ninth PMOS transistor and a fourth node between the ninth NMOS transistor and the eighth NMOS transistor, and a fourth inverter including an input terminal connected with a node between the twelfth PMOS transistor and the twelfth NMOS transistor and a node between the thirteenth PMOS transistor and the thirteenth NMOS transistor.

17. The flip-flop of claim 16,
wherein the first inverter receives an input data bit,
wherein the gate electrode of the first PMOS transistor and the gate electrode of the first NMOS transistor receive an output signal of the first inverter,
wherein a gate electrode of the second PMOS transistor is connected with the input terminal of the second inverter,
wherein a gate electrode of the second NMOS transistor is connected with the input terminal of the third inverter, and
wherein a gate electrode of the third PMOS transistor and a gate electrode of the third NMOS transistor receive a clock signal, and wherein a node between the third PMOS transistor and the third NMOS transistor outputs a clock bar signal.

18. The flip-flop of claim 17,
wherein a gate electrode of the fifth PMOS transistor and a gate electrode of the fifth NMOS transistor input the input data bit,
wherein a gate electrode of the fourth PMOS transistor and a gate electrode of the sixth NMOS transistor receive the clock bar signal, and
wherein a gate electrode of the fourth NMOS transistor and a gate electrode of the sixth PMOS transistor receive the clock signal.

19. The flip-flop of claim 17,
wherein a gate electrode of the ninth PMOS transistor and a gate electrode of the ninth NMOS transistor input the input data bit,
wherein a gate electrode of the eighth PMOS transistor and a gate electrode of the tenth NMOS transistor receive the clock signal, and
wherein a gate electrode of the eighth NMOS transistor and a gate electrode of the tenth PMOS transistor receive the clock bar signal.

20. The flip-flop of claim 17,
wherein a gate electrode of the twelfth PMOS transistor and a gate electrode of the twelfth NMOS transistor are connected with the output terminal of the second inverter,
wherein a gate electrode of the thirteenth PMOS transistor and a gate electrode of the thirteenth NMOS transistor are connected with the output terminal of the third inverter, and
wherein the fourth inverter outputs an output data bit.

* * * * *